United States Patent
Fujio et al.

(10) Patent No.: US 11,133,441 B2
(45) Date of Patent: Sep. 28, 2021

(54) LIGHT EMITTING DEVICE AND LIGHTING FIXTURE PROVIDED WITH THE SAME

(71) Applicant: NICHIA CORPORATION, Anan (JP)

(72) Inventors: Kazushige Fujio, Tokushima (JP); Sadakazu Wakui, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/586,883

(22) Filed: Sep. 27, 2019

(65) Prior Publication Data

US 2020/0105981 A1     Apr. 2, 2020

(30) Foreign Application Priority Data

Sep. 28, 2018 (JP) .............................. JP2018-184537
Sep. 20, 2019 (JP) .............................. JP2019-170972

(51) Int. Cl.
    *H01L 33/50*        (2010.01)
    *H01L 33/00*        (2010.01)
                (Continued)

(52) U.S. Cl.
    CPC .......... *H01L 33/504* (2013.01); *H01L 33/507* (2013.01); *H01L 33/486* (2013.01); *H01L 33/62* (2013.01)

(58) Field of Classification Search
    CPC ... H01L 33/50–508; H01L 33/502–504; H01L 33/58–60; H01L 2933/0041;
                       (Continued)

(56) References Cited

U.S. PATENT DOCUMENTS 9,837,584 B2   12/2017   Yoo et al.
9,837,585 B2   12/2017   Kim et al.
(Continued)

FOREIGN PATENT DOCUMENTS

JP       2016515770 A    5/2016
JP       20160540070 A    12/2016
(Continued)

OTHER PUBLICATIONS

Karan R. Aggarwala, "Accomodation to Monochromatic and White-Light Targets" Invesitgative Ophthalmology & Visual Science, vol. 36, No. 13, pp. 2695-2705 (1995).
(Continued)

*Primary Examiner* — Natalia A Gondarenko
(74) *Attorney, Agent, or Firm* — Hunton Andrews Kurth LLP

(57) ABSTRACT

Provided is a light emitting device, comprising: a light emitting element including a light emission peak wavelength in a range of 440 nm or more and 470 nm or less; a first fluorescent material having a light emission peak wavelength in a range of 480 nm or more and 518 nm or less; a second fluorescent material having a light emission peak wavelength in a range of 510 nm or more and less than 590 nm and having an x value of the chromaticity coordinate in CIE1931 in a range of 0.27 or more and 0.40 or less; and a third fluorescent material having a light emission peak wavelength in a range of 590 nm or more and 670 nm or less. The light emitting device is capable of reducing the human eye fatigue and having a light emission spectrum with excellent visual work.

11 Claims, 11 Drawing Sheets

(51) Int. Cl.
*H01L 51/50* (2006.01)
*H01L 33/48* (2010.01)
*H01L 33/62* (2010.01)

(58) Field of Classification Search
CPC ..... H01L 2933/0058; H01L 2933/0083; H01L 2933/0091; H01L 33/504; H01L 33/507; H01L 33/486; H01L 33/62; C09K 11/025; C09K 11/7734; C09K 11/0883; C09K 11/665; C09K 11/7707; C09K 11/7774; H02F 2001/133614
USPC ........ 257/89, 98, 99, 100, E33.061, E33.059
See application file for complete search history.

(56) References Cited

U.S. PATENT DOCUMENTS

| | | |
|---|---|---|
| 10,020,428 B2 | 7/2018 | Kim |
| 10,069,046 B2 | 9/2018 | Yoo et al. |
| 2006/0164005 A1* | 7/2006 | Sun .................... C09K 11/7774 313/503 |
| 2013/0143334 A1 | 6/2013 | Cheng et al. |
| 2014/0042896 A1* | 2/2014 | Sakuta .................... H01L 33/08 313/501 |
| 2015/0377429 A1 | 12/2015 | Yoo et al. |
| 2016/0218255 A1 | 7/2016 | Kim |
| 2016/0276548 A1 | 9/2016 | Yoo et al. |
| 2016/0293808 A1 | 10/2016 | Kim et al. |
| 2017/0005239 A1* | 1/2017 | Asai .................... C09K 11/7774 |
| 2017/0256684 A1 | 9/2017 | Asai |

FOREIGN PATENT DOCUMENTS

| | | |
|---|---|---|
| JP | 2017017317 A | 1/2017 |
| JP | 2017502528 A | 1/2017 |
| JP | 2017168795 A | 9/2017 |
| JP | 2017183522 A | 10/2017 |

OTHER PUBLICATIONS

Karan R. Aggarwala, "Spectral bandwidth and ocular accomodation", L. Opt. Soc. Am. A., vol. 12, No. 3, pp. 450-455 (1995).

LN Thibos, "Effect of ocular chromatic aberration on monocular visual performance", Optometry & Vision Science, vol. 68, No. 8, pp. 599-607 (1991).

Lucas, R.J., "Measuring and using light in the melanopsin age", Trends Neurosci., vol. 37, No. 1, pp. 1-9 (2014).

* cited by examiner

LIGHT EMITTING DEVICE AND LIGHTING FIXTURE PROVIDED WITH THE SAME

CROSS-REFERENCE TO RELATED PATENT APPLICATION

This application claims priority to Japanese Patent Application No. 2018-184537, filed on Sep. 28, 2018, and Japanese Patent Application No. 2019-170972, filed on Sep. 20, 2019, the entire disclosures of which are incorporated herein by references in their entirety.

BACKGROUND

Technical Field

The present disclosure relates to a light emitting device and a lighting fixture provided with the same.

Description of Related Art

As a light emitting device using a light emitting element, such as a light emitting diode (hereinafter referred to as "LED"), a white light emitting device using a light emitting element of blue light emission and a fluorescent material of yellow light emission is well known. Such a light emitting device is used in a broad field inclusive of general lighting, in-vehicle lighting, display, and backlight for liquid crystal. With the spread of LED lighting, lighting focusing on any influences of blue light contained in the LED lighting giving to the human body or circadian rhythm (biorhythm) of a human being is watched, and product development from the viewpoint of any influences against human health or psychosomatic reaction is desired. In particular, improvement of working efficiency such that fatigue is hardly caused in visual work in a lighting environment is important from the standpoint of enhancing the human health or work efficiency. In this specification, the "fluorescent material" is used in the same meaning as a "fluorescent phosphor".

Non-Patent Literatures 1 and 2 report that when the distribution obtained through multiplication of the relative spectral distribution by the spectral luminous efficiency V (λ) is defined as effective spectra, light having a wider band width (wavelength width of spectrum) is high in focus adjusting ability by the human ocular muscles.

Non-Patent Literature 3 reports that the wavelength at which the human eyes easily adjust the focus is typically the vicinity of 555 nm that is a peak of luminous sensitivity. When the band width (wavelength width) centering on 555 nm in the light emission spectrum is narrow, the adjusting power of the eyes is lowered, leading to eye fatigue. Namely, in the lighting having a wider spectral distribution of band width (wavelength width) in a range of from 480 nm to 680 nm of the light emission spectrum centering on 555 nm, the human eye fatigue is reduced.

In addition, as for the human eye fatigue, glare is also feared in not only photopic vision but also mesopic vision. With respect to the glare, among cone cells known as photoreceptor cells of human retina, in addition to the fact that excessive stimulation to an S cone is a cause, stimulation of an M cone may also be a cause. Non-Patent Literature 4 reports the spectral sensitivity distributions of an S cone, an M cone, and an L cone that are cone cells of the human retina, ipRGC (intrisically photosensitive retinal ganglion cell) (also referred to as mRGC (melanopsin containing retinal ganglion cell), and a rod cell.

CITATION LIST

Non-Patent Literature

Non-Patent Literature 1: Karan R. Aggarwala, "Accommodation to Monochromatic and White-Light Targets" Investigative Ophthalmology & Visual Science, vol. 36, No. 13, pp. 2695-2705 (1995)

Non-Patent Literature 2: Karan R. Aggarwala, "Spectral bandwidth and ocular accommodation", L. Opt. Soc. Am. A., vol. 12, No. 3, pp. 450-455 (1995)

Non-Patent Literature 3: LN THIBOS, "Effect of ocular chromatic aberration on monocular visual performance", Optometry & Vision Science, vol. 68, No. 8, pp. 599-607 (1991)

Non-Patent Literature 4: Lucas, R. J, "Measuring and using light in the melanopsin age", Trends Neurosci., vol. 37, No. 1, pp. 1-9 (2014)

SUMMARY

From the aforementioned reports, it may be considered that in the lighting having a wider spectral distribution of band width in a range of from 480 nm to 680 nm of the light emission spectra centering on 555 nm, the human eye fatigue is reduced. In addition, from the standpoint of reduction of the human eye fatigue and safety of visual work, as a countermeasure for the glare in not only photopic vision but also mesopic vision, lighting which is low in excessive stimulation to an M cone that is one of human photoreceptor cells is also desired. However, when the band width (wavelength width) centering 555 nm is widened, the luminous flux is lowered. For that reason, it is difficult to provide a light emission device in which both widening of the band width (wavelength width) for reducing the human eye fatigue and enhancement of luminous efficiency are made compatible with each other.

Then, an embodiment of the present disclosure is aimed to provide a light emitting device capable of reducing the human eye fatigue and having light emission spectra with excellent visual work and a lighting fixture provided with the same.

The present invention includes the following embodiments.

A light emitting device, comprising:
a light emitting element having a light emission peak wavelength in a range of 440 nm or more and 470 nm or less,
a first fluorescent material having a light emission peak wavelength in a range of 480 nm or more and 518 nm or less,
a second fluorescent material having a light emission peak wavelength in a range of 510 nm or more and less than 590 nm and having an x value of the chromaticity coordinate in CIE1931 in a range of 0.27 or more and 0.40 or less, and
a third fluorescent material having a light emission peak wavelength in a range of 590 nm or more and 670 nm or less,
wherein,
when the content (% by mass) of the first fluorescent material relative to a total amount of the first fluorescent material, the second fluorescent material and the third fluorescent material is defined as $MP_1$, a content (% by mass) of the second fluorescent material relative to the total amount of the first fluorescent material, the second fluorescent material and the third fluorescent material is defined as $MP_2$, a maximum wavelength width (nm) at which when a maximum value of a light emission intensity in a light emission spectrum of the light emitting device is defined as 1, a light emission intensity in a range of 480 nm or more and 680 nm or less is 0.3 or more is defined as $I^1_{0.3}$, and a maximum wavelength width (nm) at which when the maximum value of the light emission intensity in the light emission spectrum of the light emitting device is defined as 1, a light emission intensity in a range of 480 nm or more and 580 nm or less is 0.3 or more is defined as $I^2_{0.3}$, in the case where a correlated color temperature falls within each of the following ranges, the $MP_1$, $MP_2$, $I^1_{0.3}$ and $I^2_{0.3}$ satisfy the following, respectively:

in the case where the correlated color temperature is in a range of 2,000K or higher and lower than 2,800K, $MP_1$ is in a range of 5% by mass or more and 50% by mass or less, $MP_2$ is in a range of 40% by mass or more and 90% by mass or less, and $I^1_{0.3}$ is in a range of 177 nm or more and 200 nm or less, and $I^2_{0.3}$ is in a range of 80 nm or more and 100 nm or less, in the case where the correlated color temperature is in a range of 2,800K or higher and lower than 3,500K, $MP_1$ is in a range of 5% by mass or more and 50% by mass or less, $MP_2$ is in a range of 40% by mass or more and 90% by mass or less, and $I^1_{0.3}$ is in a range of 183 nm or more and 200 nm or less, and $I^2_{0.3}$ is in a range of 86 nm or more and 100 nm or less, in the case where the correlated color temperature is in a range of 3, 500K or higher and lower than 4,500K, $MP_1$ is in a range of 5% by mass or more and 65% by mass or less, $MP_2$ is in a range of 30% by mass or more and 85% by mass or less, and $I^1_{0.3}$ is in a range of 173 nm or more and 200 nm or less, and $I^2_{0.3}$ is in a range of 90 nm or more and 100 nm or less, in the case where the correlated color temperature is in a range of 4,500K or higher and lower than 5,700K, $MP_1$ is in a range of 5% by mass or more and 50% by mass or less, $MP_2$ is in a range of 40% by mass or more and 80% by mass or less, and $I^1_{0.3}$ is in a range of 140 nm or more and 180 nm or less, and $I^2_{0.3}$ is in a range of 85 nm or more and 100 nm or less, and in the case where the correlated color temperature is in a range of 5,700K or higher and 7,200K or lower, $MP_1$ is in a range of 5% by mass or more and 50% by mass or less, $MP_2$ is in a range of 40% by mass or more and 80% by mass or less, and $I^1_{0.3}$ is in a range of 110 nm or more and 160 nm or less, and $I^2_{0.3}$ is in a range of 81 nm or more and 100 nm or less.

A second embodiment of the present disclosure is concerned with a lighting fixture provided with the aforementioned light emitting device.

In accordance with the present disclosure, it is possible to provide a light emitting device capable of reducing the human eye fatigue and having light emission spectra with excellent visual work and a lighting fixture provided with the same.

DETAILED DESCRIPTION

Figure 1:
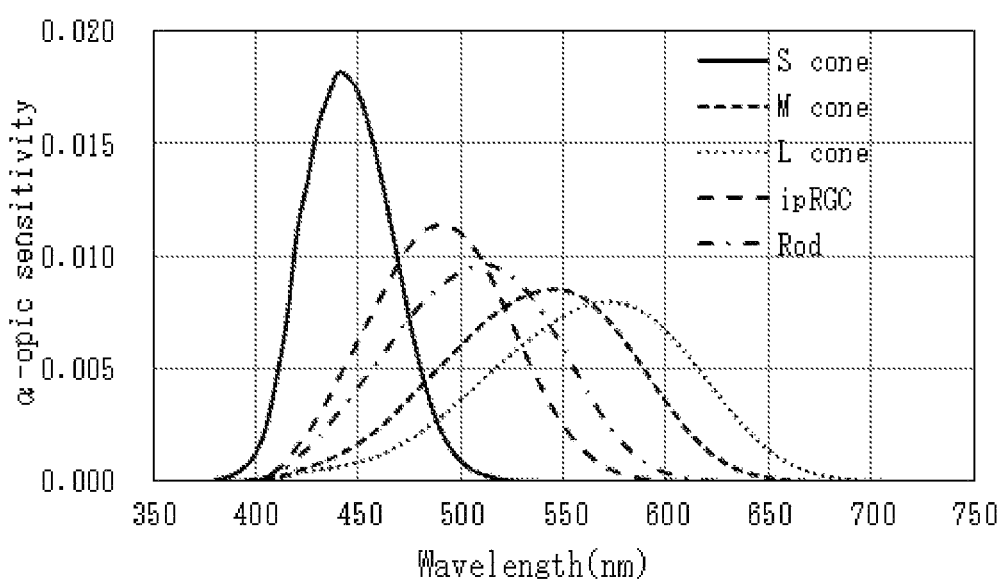
FIG. 1 is a diagram showing spectral sensitivity distributions of an S cone, an M cone, an L cone, an ipRGC, and a rod cell each of which is a human photoreceptor.

The embodiments of the present invention are hereunder described by reference to the accompanying drawings. However, the embodiments below are those exemplifying a light emitting device and a lighting fixture provided with the same for the purpose of embodying the technical spirit of the present invention, and it should be construed that the present invention is not limited to the following light emitting devices and lighting fixtures provided with the same. In addition, it should be construed that the members shown in the claims are by no means limited to members of the embodiments. Especially, unless otherwise specified, any dimensions, materials, shapes, relative arrangements, and so on of the structural members described in the embodiments are not intended to limit the scope of claims only but are merely explanatory examples. A relation between a color name and a chromaticity coordinate, a relation between a wavelength range of light and a color name of monochromatic light, and so on follow JIS Z8110. In this specification, unless otherwise specified, in the case where plural substances corresponding to each component are existent in a composition, the content of the each component in the composition means a total amount of the plural substances existing in the composition. In addition, the average particle diameter is a numerical value called as a Fisher Sub Sieve Sizer's No. and is measured by the air permeability method. A full width at half maximum of the light emitting element or fluorescent material means a wavelength width of light emission spectra showing a light emission intensity of 50% of the maximum light emission intensity in the light emission spectra.

Light Emitting Device

The light emitting device according to an embodiment of the present disclosure is a light emitting device provided with a light emitting element having a light emission peak wavelength in a range of 440 nm or more and 470 nm or less; and a fluorescent member including a first fluorescent material having a light emission peak wavelength in a range of 480 nm or more and 518 nm or less, a second fluorescent material having a light emission peak wavelength in a range of 510 nm or more and less than 590 nm and having an x value of the chromaticity coordinate in CIE1931 in a range of 0.27 or more and 0.40 or less, and a third fluorescent material having a light emission peak wavelength in a range of 590 nm or more and 670 nm or less, wherein when the content (% by mass) of the first fluorescent material relative to the total amount of the whole of fluorescent materials is defined as $MP_1$, the content (% by mass) of the second fluorescent material relative to the total amount of the whole of fluorescent materials is defined as $MP_2$, and a maximum wavelength width (nm) at which when a maximum value of a light emission intensity in the light emission spectra of the light emitting device is defined as 1, the light emission intensity in a range of 480 nm or more and 680 nm or less is 0.3 or more is defined as $I^1_{0.3}$ (hereinafter occasionally referred to simply as "$I^1_{0.3}$" or "wavelength width $I^1_{0.3}$") in the case where a correlated color temperature falls within each of the following ranges (1) to (5), the $MP_1$, $MP_2$, and $I^1_{0.3}$ are satisfied with the following conditions of (1) to (5), respectively:

(1) In the case where the correlated color temperature is in a range of 2,000K or higher and lower than 2,800K, the $MP_1$ is in a range of 5% by mass or more and 50% by mass or less, the $MP_2$ is in a range of 40% by mass or more and 90% by mass or less, and the $I^1_{0.3}$ is in a range of 177 nm or more and 200 nm or less, preferably in a range of 177 nm or more and 190 nm or less, and more preferably in a range of 177 nm or more and 183 nm or less;

(2) In the case where the correlated color temperature is in a range of 2,800K or higher and lower than 3,500K, the $MP_1$ is in a range of 5% by mass or more and 50% by mass or less, the $MP_2$ is in a range of 40% by mass or more and 90% by mass or less, and the $I^1_{0.3}$ is in a range of 183 nm or more and 200 nm or less, preferably in a range of 184 nm or more and 200 nm or less, and more preferably in a range of 185 nm or more and 200 nm or less;

(3) In the case where the correlated color temperature is in a range of 3,500K or higher and lower than 4,500K, the $MP_1$ is in a range of 5% by mass or more and 65% by mass or less, the $MP_2$ is in a range of 30% by mass or more and 85% by mass or less, and the $I^1_{0.3}$ is in a range of 173 nm or more and 200 nm or less, preferably in a range of 175 nm or more and 200 nm or less, and more preferably in a range of 177 nm or more and 200 nm or less;

(4) In the case where the correlated color temperature is in a range of 4,500K or higher and lower than 5,700K, the $MP_1$ is in a range of 5% by mass or more and 50% by mass or less, the $MP_2$ is in a range of 40% by mass or more and 80% by mass or less, and the $I^1_{0.3}$ is in a range of 140 nm or more and 180 nm or less, preferably in a range of 143 nm or more and 180 nm or less, and more preferably in a range of 149 nm or 180 nm or less; and (5) In the case where the correlated color temperature is in a range of 5,700K or higher and 7,200K or lower, the $MP_1$ is in a range of 5% by mass or more and 50% by mass or less, the $MP_2$ is in a range of 40% by mass or more and 80% by mass or less, and the $I^1_{0.3}$ is in a range of 110 nm or more and 160 nm or less, preferably in a range of 130 nm or more and 159 nm or less, and more preferably in a range of 135 nm or more and 159 nm or less.

In the light emission spectra of the light emitting device, when the maximum value of the light emission intensity is defined as 1, as for the maximum wavelength width $I^1_{0.3}$ at which the light emission intensity in a range of 480 nm or more and 680 nm or less is 0.3 or more, the wavelength width is expanded so as to fall within a predetermined range according to the correlated color temperature of light emitted by the light emitting device. In the light emission spectra of the light emitting device, in view of the fact that the wavelength width $I^1_{0.3}$ in the range of 480 nm or more and 680 nm or less centering on 555 nm is expanded, the light emitting device is able to reduce the human eye fatigue under lighting of this light emitting device and to efficiently perform the human visual work. In addition, in this way, even in the case of expanding the wavelength width $I^1_{0.3}$ in the light emission spectra of the light emitting device, the light emitting device is able to suppress a reduction of the luminous flux emitted from the light emitting device and to maintain the high luminous efficiency.

When a maximum wavelength width (nm) at which when a maximum value of a light emission intensity in the light emission spectrum of the light emitting device is defined as 1, the light emission intensity in a range of 480 nm or more and 580 nm or less is 0.3 or more is defined as $I^2_{0.3}$ (hereinafter occasionally referred to simply as "$I^2_{0.3}$" or "wavelength width $I^2_{0.3}$"), in the case where a correlated color temperature of the light emitting device falls within each of the following ranges of (6) to (10), it is preferred that the $I^2_{0.3}$ is satisfied with the following conditions of (6) to (10), respectively:

(6) In the case where the correlated color temperature is in a range of 2,000K or higher and lower than 2,800K, the $I^2_{0.3}$ is in a range of 80 nm or more and 100 nm or less, preferably in a range of 82 nm or more and 100 nm or less, and more preferably in a range of 84 nm or more and 100 nm or less;

(7) In the case where the correlated color temperature is in a range of 2,800K or higher and lower than 3,500K, the $I^2_{0.3}$ is in a range of 86 nm or more and 100 nm or less, preferably in a range of 90 nm or more and 100 nm or less, and more preferably in a range of 92 nm or more and 100 nm or less;

(8) In the case where the correlated color temperature is in a range of 3,500K or higher and lower than 4,500K, the $I^2_{0.3}$ is in a range of 90 nm or more and 100 nm or less, preferably in a range of 91 nm or more and 100 nm or less, and more preferably in a range of 92 nm or more and 100 nm or less;

(9) In the case where the correlated color temperature is in a range of 4,500K or higher and lower than 5,700K, the $I^2_{0.3}$ is in a range of 85 nm or more and 100 nm or less, preferably in a range of 86 nm or more and 100 nm or less, and more preferably in a range of 90 nm or more and 100 nm or less; and

(10) In the case where the correlated color temperature is in a range of 5,700K or higher and 7,200K or lower, the $I^2_{0.3}$ is in a range of 81 nm or more and 100 nm or less, preferably in a range of 85 nm or more and 100 nm or less, and more preferably in a range of 90 nm or more and 100 nm or less.

In the light emission spectra of the light emitting device, when the maximum value of the light emission intensity is defined as 1, as for the maximum wavelength width $I^2_{0.3}$ at which the light emission intensity in a range of 480 nm or more and 580 nm or less is 0.3 or more, the wavelength width is expanded so as to fall within a predetermined range according to the correlated color temperature of light emitted by the light emitting device. In the light emission spectra of the light emitting device, in view of the fact that the wavelength width $I^2_{0.3}$ in the range of 480 nm or more and 580 nm or less close to 555 nm that is a peak of the typical luminous sensitivity at which the human eyes are especially easy to adjust the focus is expanded, the light emitting device is able to reduce the human eye fatigue under lighting of this light emitting device and to efficiently perform the human visual work. In addition, in this way, even in the case where the wavelength width $I^2_{0.3}$ is expanded in the light emission spectra of the light emitting device, the light emitting device is able to suppress a reduction of the luminous flux emitted from the light emitting device and to maintain the high luminous efficiency.

In the light emission spectra of the light emitting device, when the light emission intensity at 480 nm in a light emission spectrum of the light emitting device is defined as $I_{480}$ (hereinafter occasionally referred to simply as "$I_{480}$" or "intensity ratio $I_{480}$") when a maximum value of the light emission intensity of the light emitting element is defined as 1, in the case where a correlated color temperature of the light emitting device falls within each of the following ranges of (11) to (15), it is preferred that the $I_{480}$ is satisfied with the following conditions of (11) to (15), respectively:

(11) In the case where the correlated color temperature is in a range of 2,000K or higher and lower than 2,800K, $I_{480}$ is preferably in a range of 0.30 or more and 0.80 or less, more preferably in a range of 0.35 or more and 0.75 or less, and still more preferably in a range of 0.40 or more and 0.70 or less;

(12) In the case where the correlated color temperature is in a range of 2,800K or higher and lower than 3,500K, $I_{480}$ is preferably in a range of 0.25 or more and 0.70 or less, more preferably in a range of 0.30 or more and 0.70 or less, and still more preferably in a range of 0.40 or more and 0.70 or less;

(13) In the case where the correlated color temperature is in a range of 3,500K or higher and lower than 4,500K, $I_{480}$ is preferably in a range of 0.20 or more and 0.60 or less, more preferably in a range of 0.30 or more and 0.55 or less, and still more preferably in a range of 0.35 or more and 0.55 or less;

(14) In the case where the correlated color temperature is in a range of 4,500K or higher and lower than 5, 700K, $I_{480}$ is preferably in a range of 0.17 or more and 0.60 or less, more preferably in a range of 0.20 or more and 0.55 or less, and still more preferably in a range of 0.25 or more and 0.50 or less; and

(15) In the case where the correlated color temperature is in a range of 5,700K or higher and 7,200K or lower, $I_{480}$ is preferably in a range of 0.16 or more and 0.50 or less, more preferably in a range of 0.20 or more and 0.45 or less, and still more preferably in a range of 0.25 or more and 0.40 or less.

In the light emission spectra of the light emitting device, the light emission intensity is increased such that when the light emission intensity of the light emitting element is defined as 1, the intensity ratio $I_{480}$ of the light emission spectra becomes a light emission intensity of a predetermined range according to the correlated color temperature of light emitted by the light emitting device. In the light emission spectra of the light emitting device, by increasing the intensity ratio $I_{480}$, the light emitting device lowers the light emission intensity of the light emitting element emitting a blue light as a cause for glare, which is close to a wavelength region in the vicinity of 440 nm acting on an S cone that is one of human photoreceptor cells, and is able to reduce the human eye fatigue to be caused due to the glare. In addition, as for the aforementioned light emitting device, by increasing the intensity ratio $I_{480}$ in the light emission spectra of the light emitting device, the stimulation to ipRGC that is one of human photoreceptor cells, which is affected by the light in a wavelength region at 480 nm, can be adjusted, and as a result, the aforementioned light emitting device also has an effect for awakening a human being during visual work and maintaining the ability of concentration. Furthermore, a bluish-green component in the light emission spectra increases, and for example, it becomes possible to constitute a light emitting device capable of compensating a lowering of discrimination of blue light with age of a human being.

FIG. 1 shows a spectral sensitivity distribution (α-optic sensitivity) of each of cells inclusive of an S cone, an M cone, an L cone, ipRGC that is an intrisically photosensitive retinal ganglion cell, and a rod cell, all of which are human photoreceptor cells, versus the wavelength (nm). The S cone has a peak wavelength of sensitivity in the vicinity of 440 nm; the M cone has a peak wavelength of sensitivity in the vicinity of 535 nm; and the L cone has a peak wavelength of sensitivity in the vicinity of 565 nm. The ipRGC is neurally responsive to photic stimulation and has a peak wavelength of sensitivity in the vicinity of 480 nm.

In a light emission spectrum of the light emitting device, in the case where the light emission intensity at 535 nm is defined as $I_A$, and an average of the light emission intensity at 510 nm and the light emission intensity at 560 nm is defined as $I_B$, a ratio of $I_A$ to $I_B$ ($I_A/I_B$) (hereinafter occasionally referred to simply as "$I_A/I_B$" or "ratio $I_A/I_B$") is preferably in a range of 0.80 or more and 0.96 or less, more preferably in a range of 0.82 or more and 0.96 or less, and still more preferably in a range of 0.83 or more and 0.95 or less. The average of the light emission intensity at 510 nm and the light emission intensity at 560 nm is one half of the sum total of the light emission intensity at 510 nm and the light emission intensity at 560 nm.

In the light emission spectra of the light emitting device, by regulating the ratio $I_A/I_B$ to be in a range of 0.80 or more and 0.96 or less, the light emission intensity of a green light in a wavelength region in the vicinity of 535 nm acting on the M cone of the human photoreceptor cell is controlled to a predetermined range, and excessive stimulation to the M cone is reduced, whereby the human eye fatigue to be caused due to the glare in not only photopic vision but also mesopic vision can be more reduced.

Figure 2:
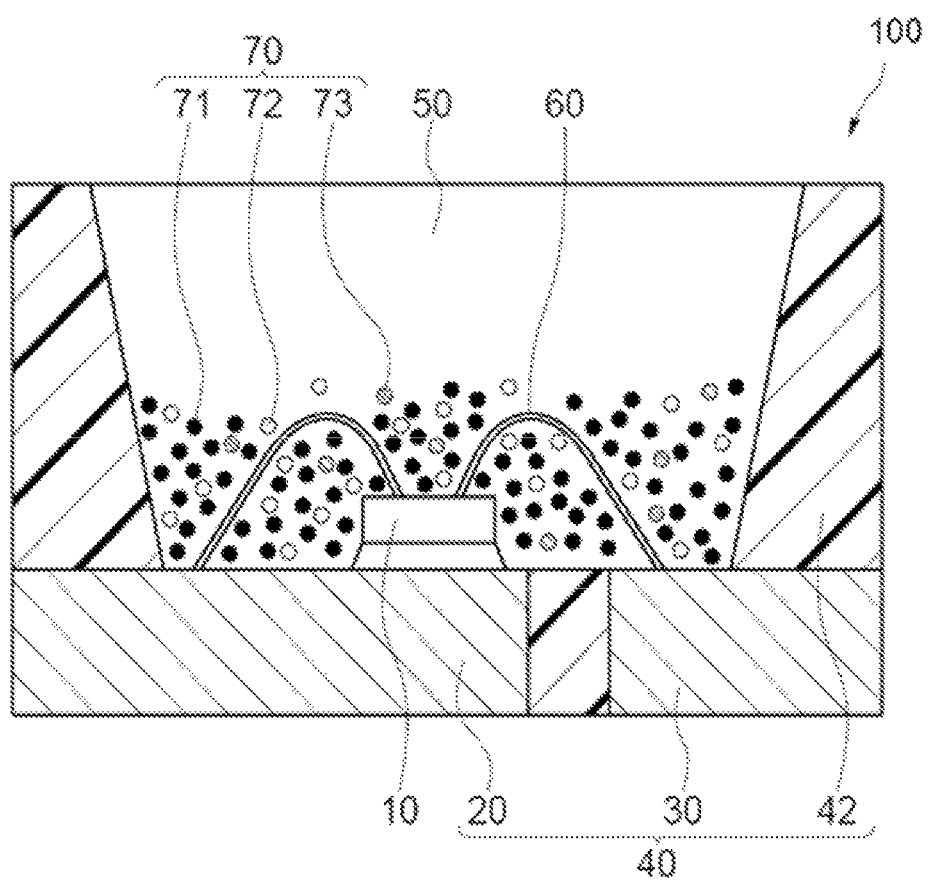
FIG. 2 is a diagrammatic cross-sectional view showing an example of a light emitting device according to the present disclosure.
Figure 3:
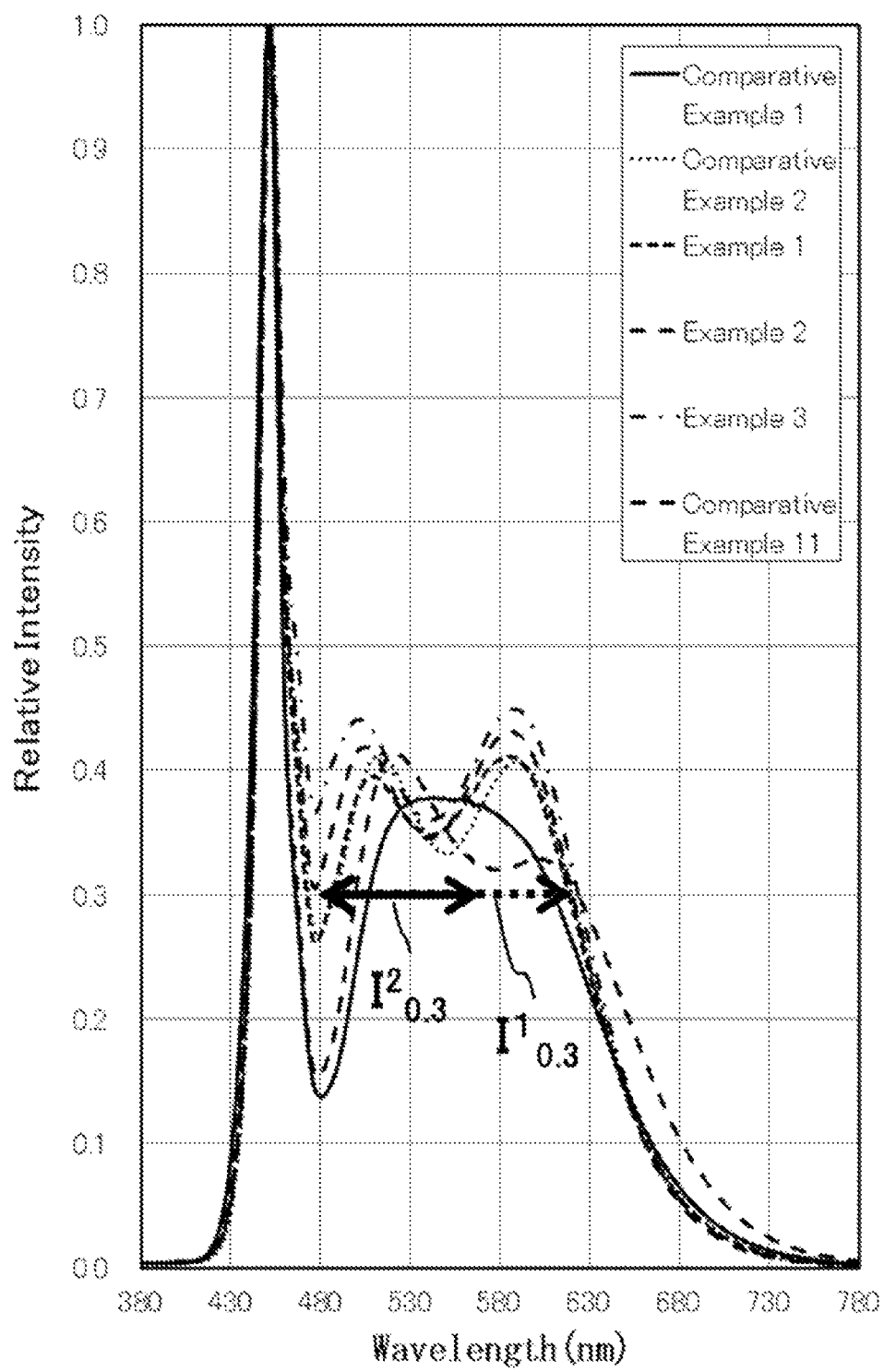
FIG. 3 is a diagram showing light emission spectra of each of the light emitting devices according to Examples 1 to 3, and Comparative Examples 1, 2 and 11.
Figure 4:
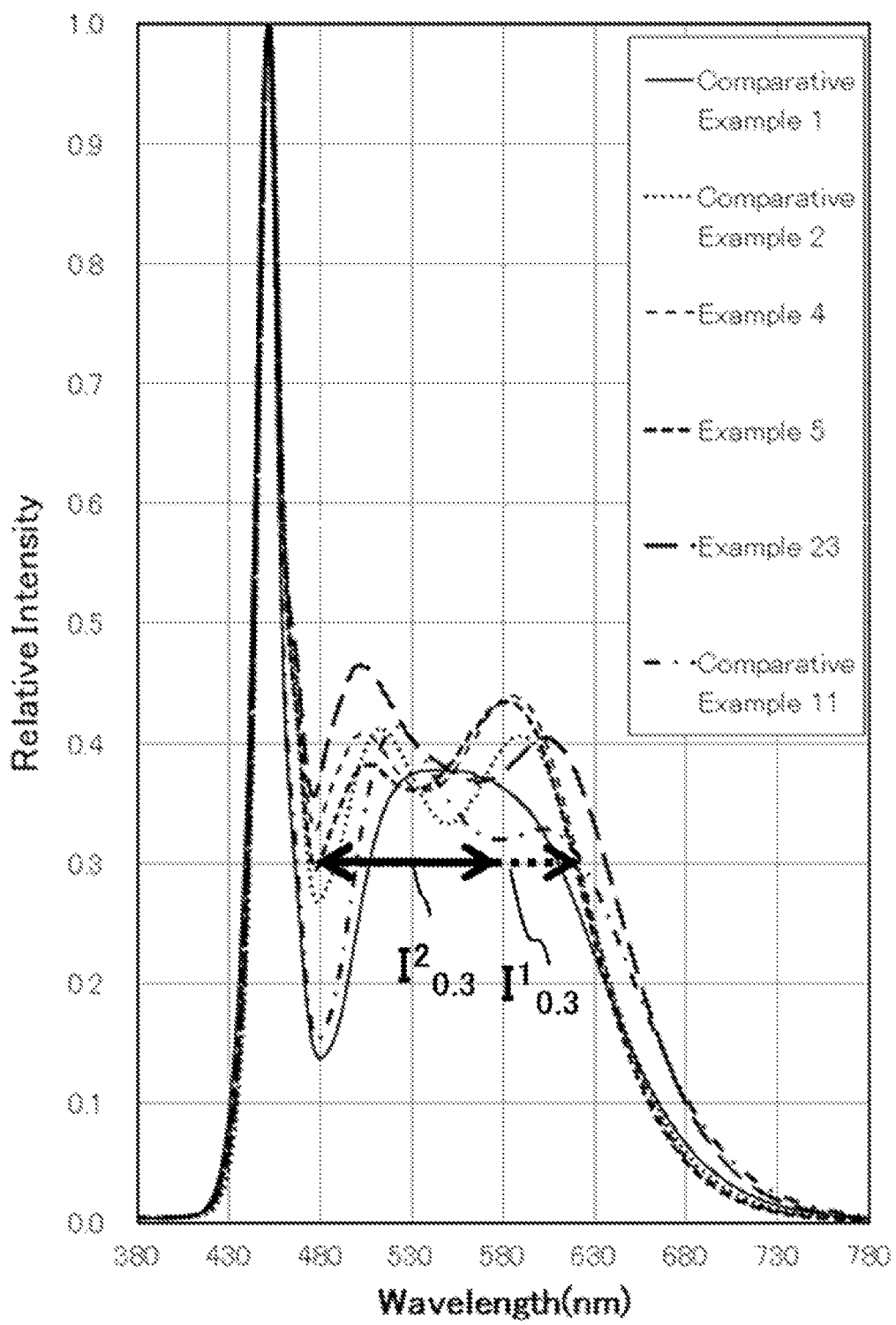
FIG. 4 is a diagram showing light emission spectra of each of the light emitting devices according to Examples 4, 5 and 23, and Comparative Examples 1, 2 and 11.
Figure 5:
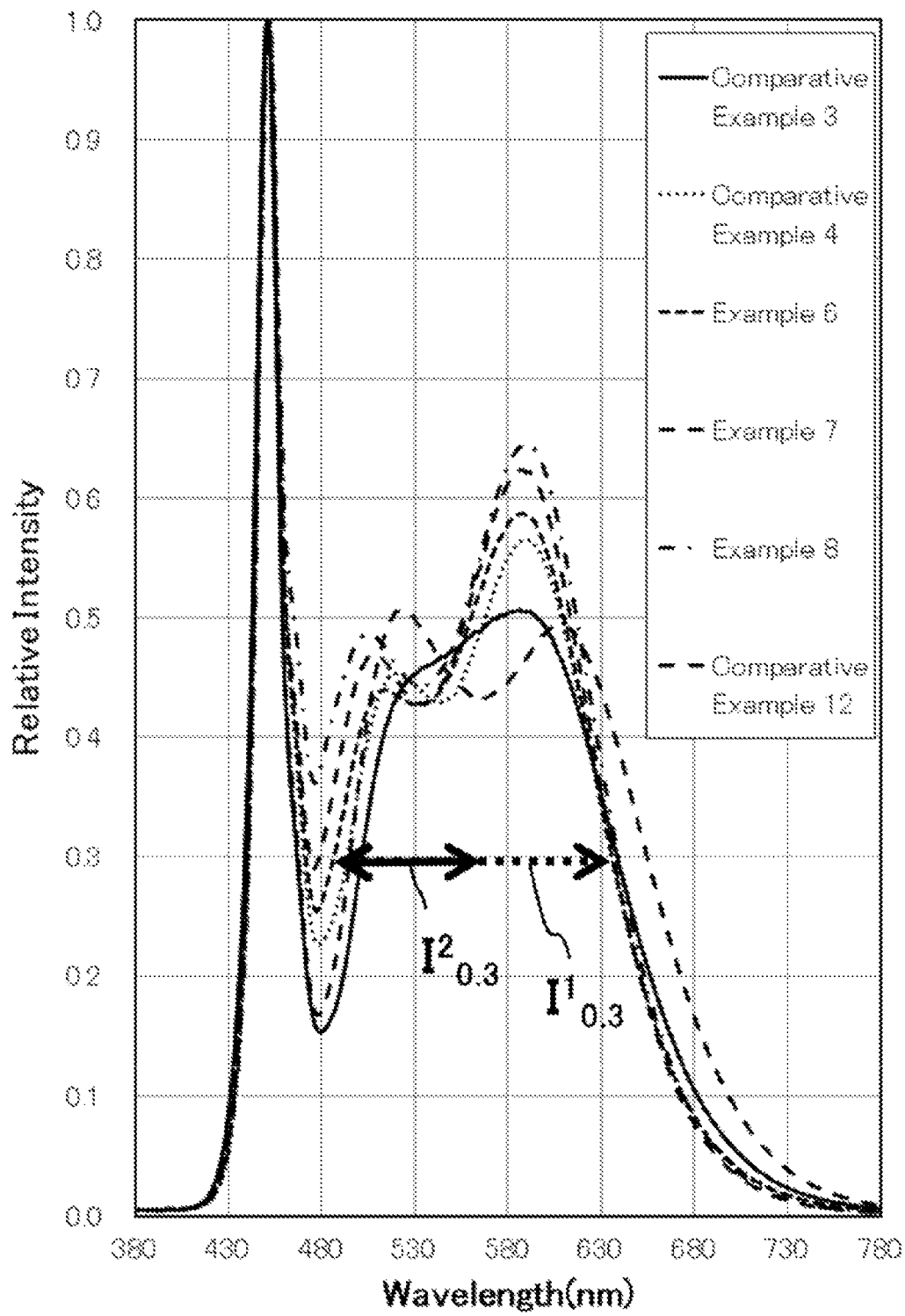
FIG. 5 is a diagram showing light emission spectra of each of the light emitting devices according to Examples 6 to 8, and Comparative Examples 3, 4 and 12.
Figure 6:
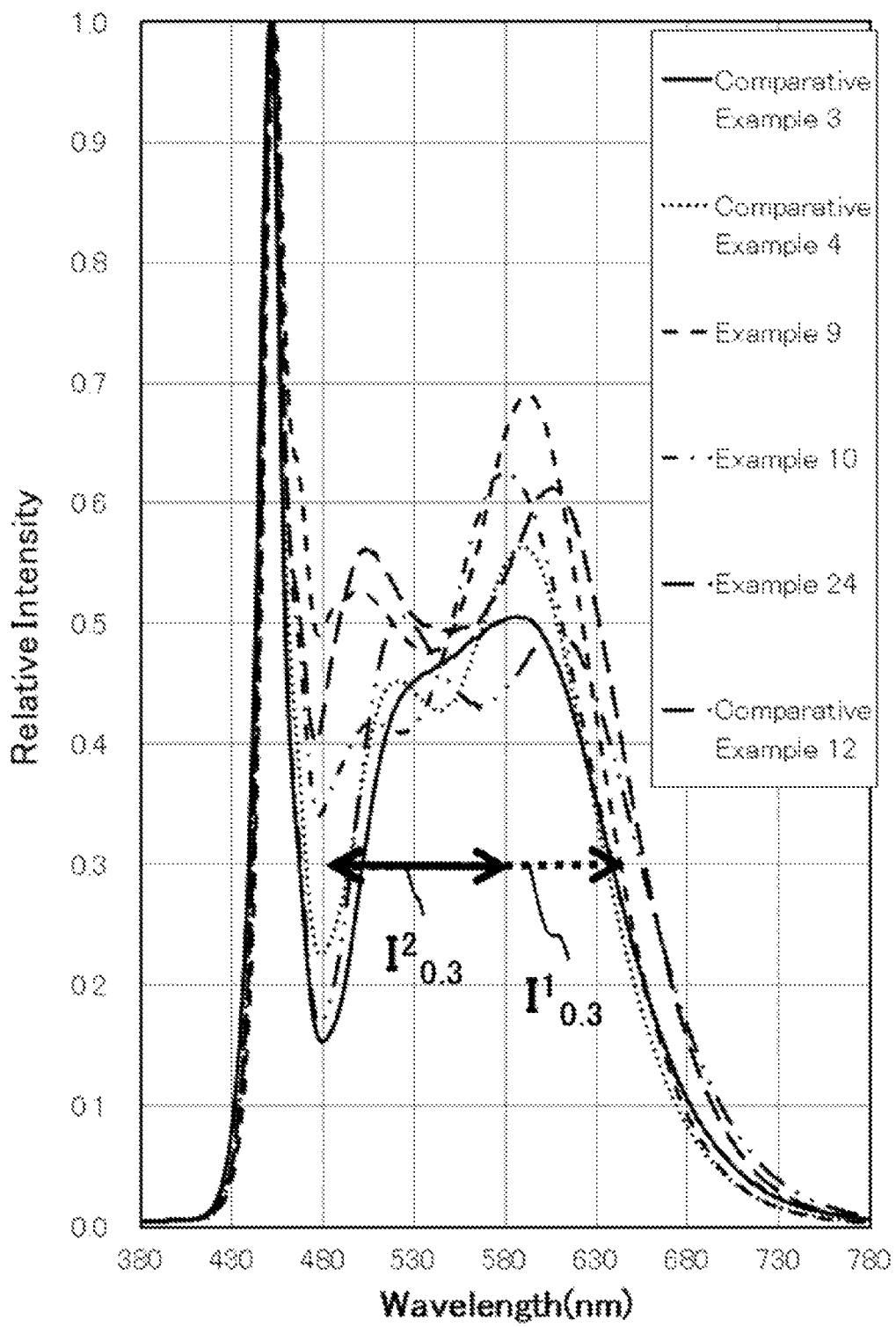
FIG. 6 is a diagram showing light emission spectra of each of the light emitting devices according to Examples 9, 10 and 24, and Comparative Examples 3, 4 and 12.
Figure 7:
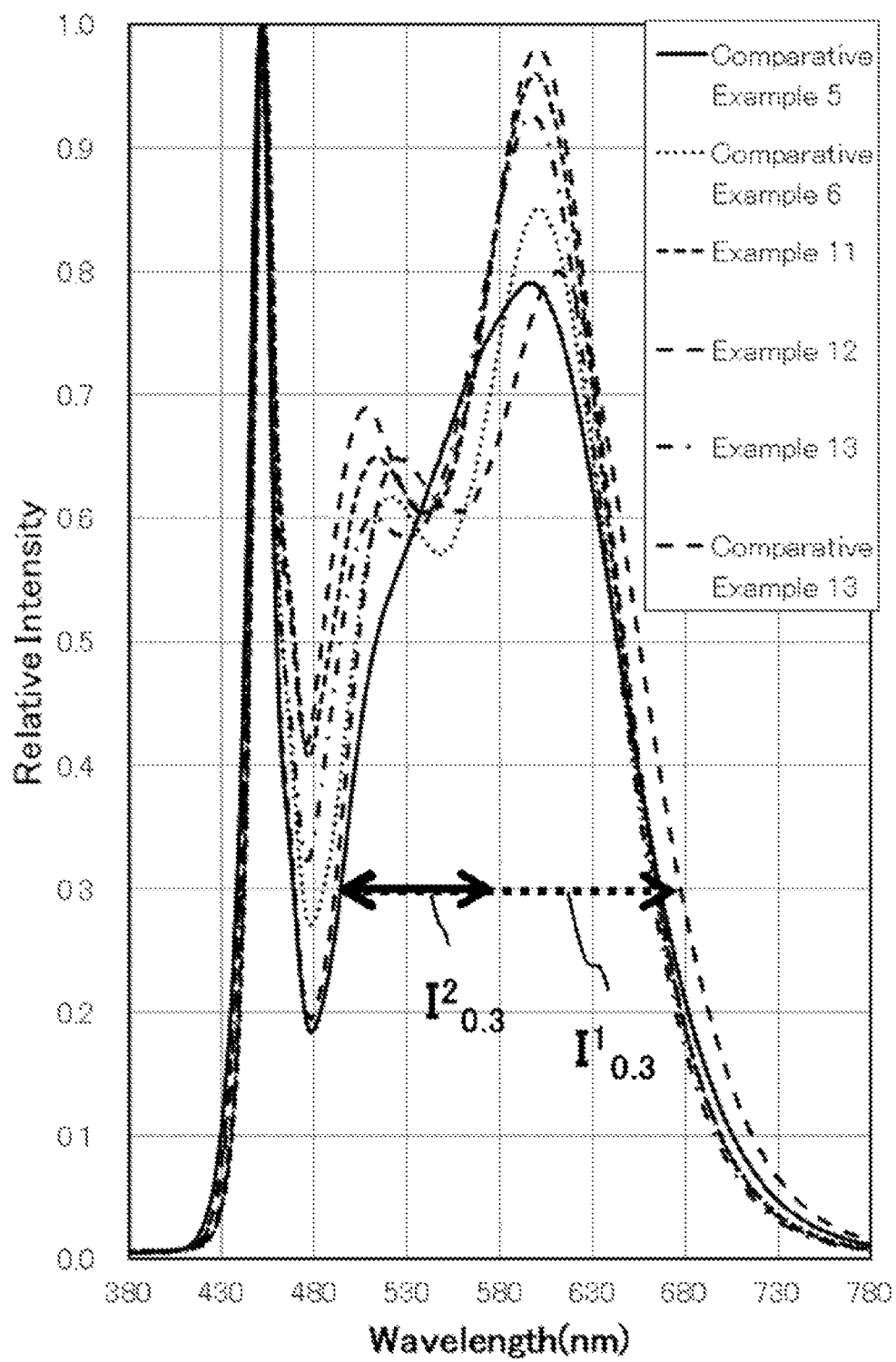
FIG. 7 is a diagram showing light emission spectra of each of the light emitting devices according to Examples 11 to 13, and Comparative Examples 5, 6 and 13.
Figure 8:
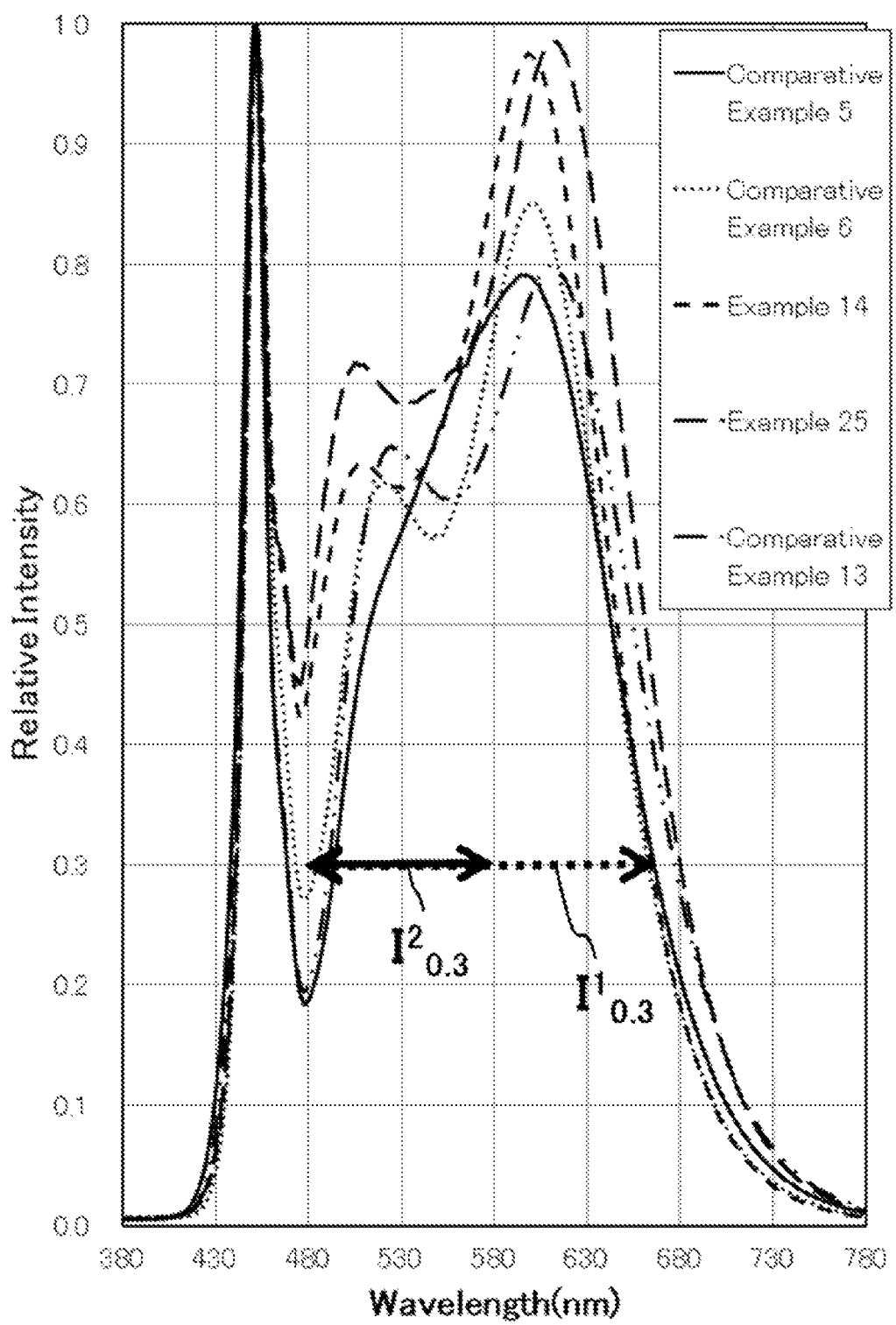
FIG. 8 is a diagram showing light emission spectra of each of the light emitting devices according to Examples 14 and 25, and Comparative Examples 5, 6 and 13.
Figure 9:
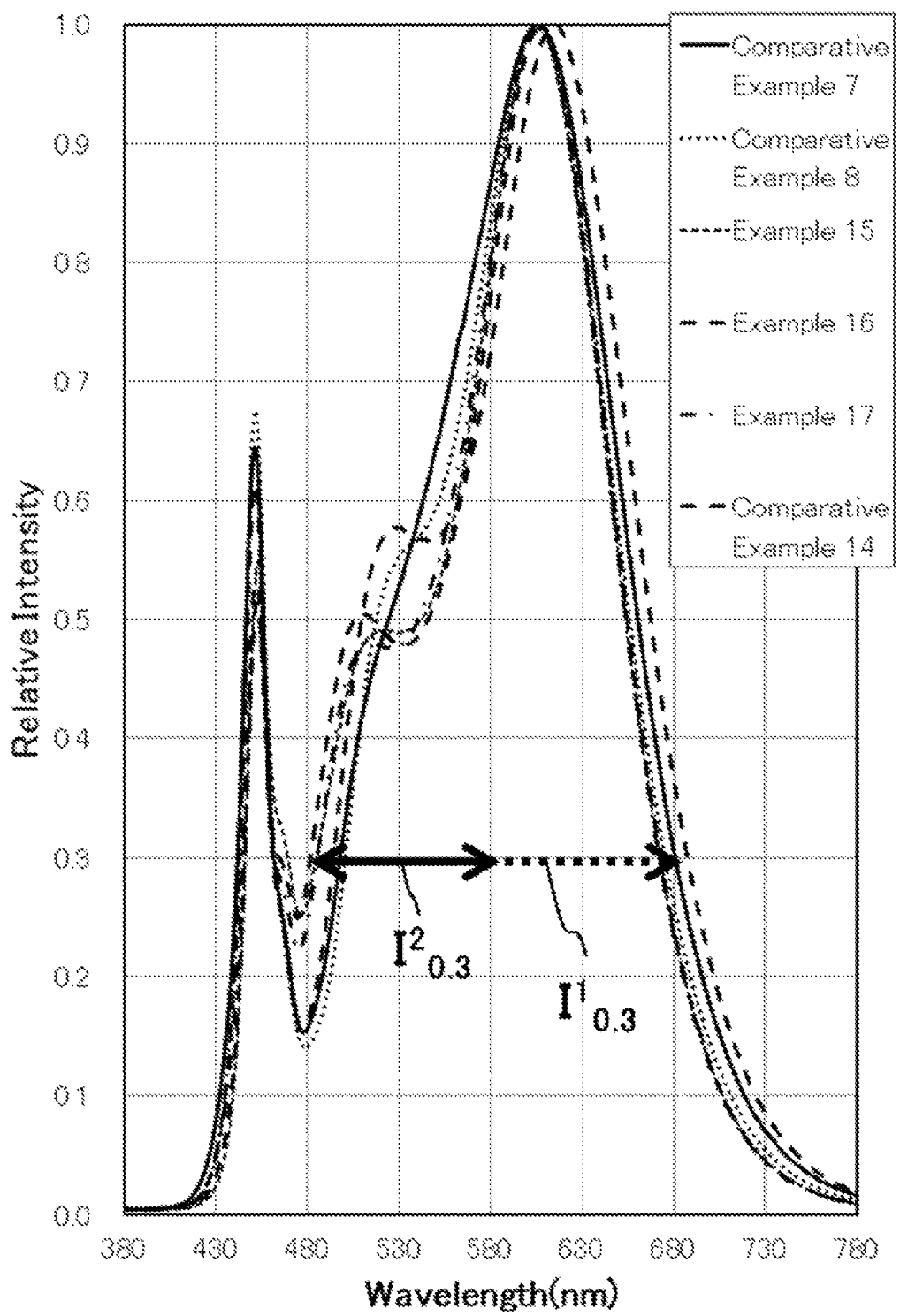
FIG. 9 is a diagram showing light emission spectra of each of the light emitting devices according to Examples 15 to 17, and Comparative Examples 7, 8 and 14.
Figure 10:
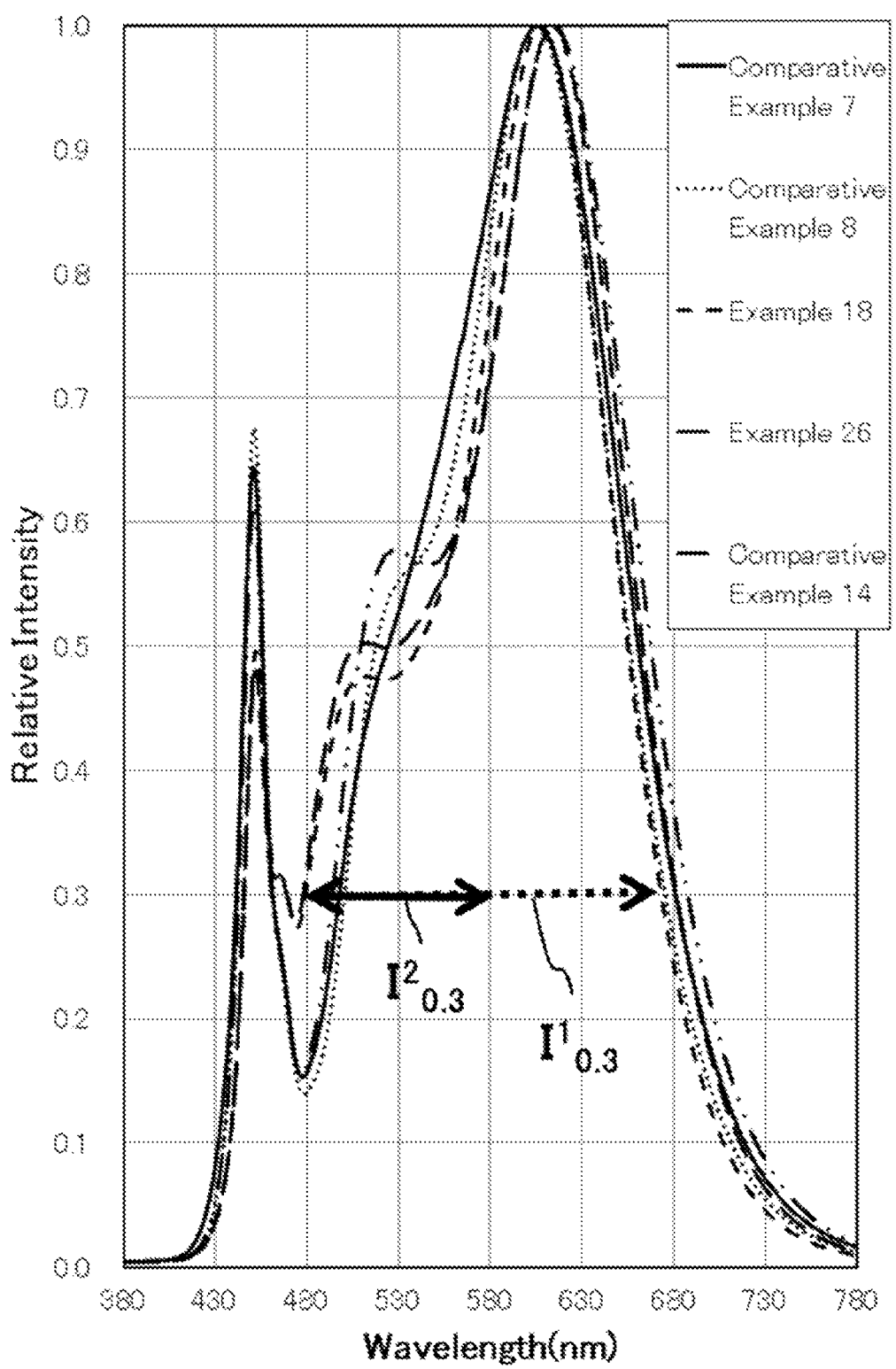
FIG. 10 is a diagram showing light emission spectra of each of the light emitting devices according to Examples 18 and 26, and Comparative Examples 7, 8 and 14.
Figure 11:
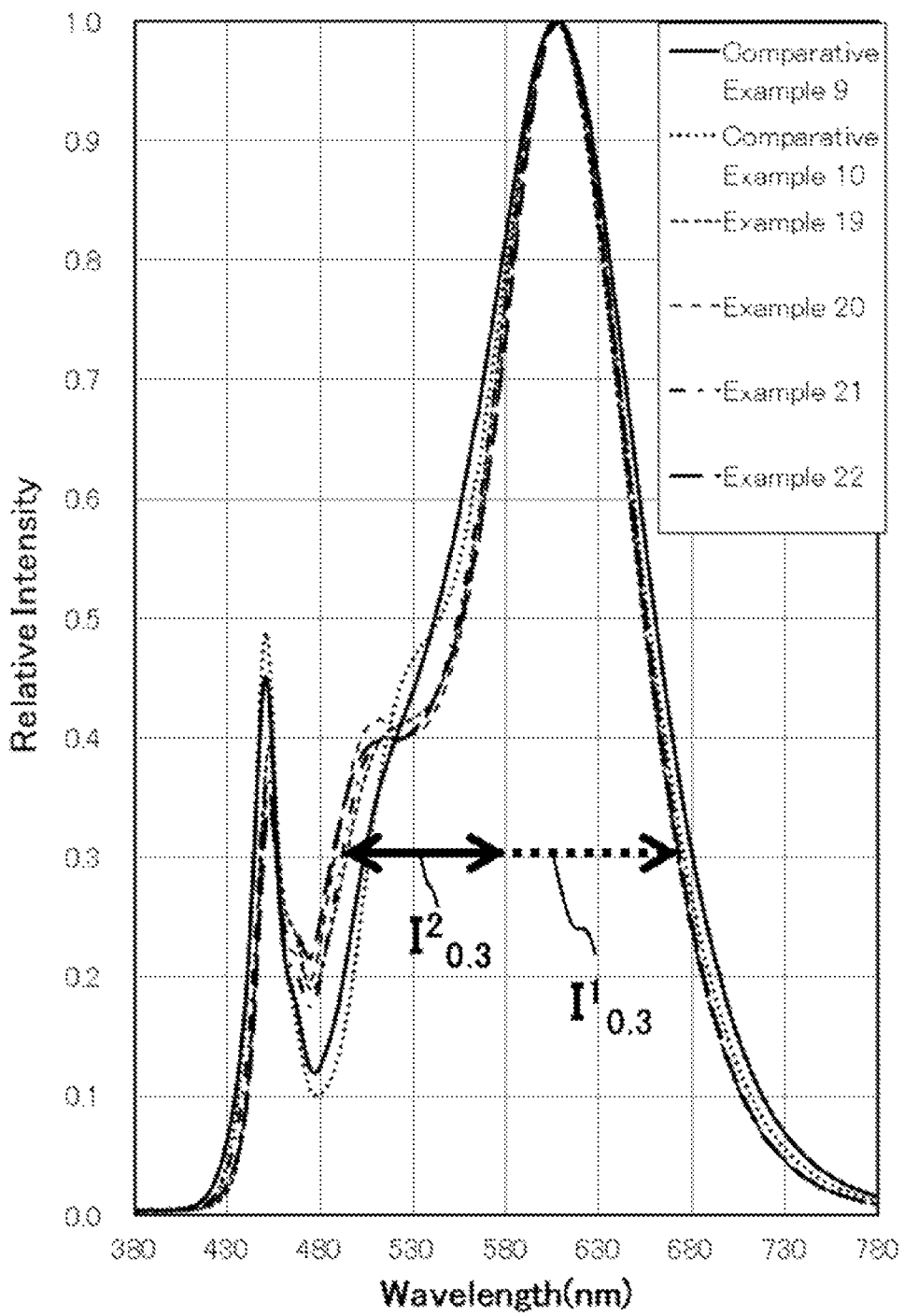
FIG. 11 is a diagram showing light emission spectra of each of the light emitting devices according to Examples 19 to 22 and Comparative Examples 9 and 10.

A light emitting device according to an embodiment of the present disclosure is described by reference to the accompanying drawing. A light emitting device 100 shown in FIG. 2 is an example of a surface mounting type light emitting device. The light emitting device 100 is provided with a light emitting element 10 emitting light at a short wavelength side of visible light (for example, in a range of 380 nm or more and 485 nm or less) and having a light emission peak wavelength in a range of 440 nm or more and 470 nm or less; and a molded article 40 arranging the light emitting element 10 thereon. The molded article 40 is one in which a first lead 20 and a second lead 30 are integrally molded with a resin part 42. The molded article 40 forms a concave having a bottom face and a side face, and the light emitting element 10 is arranged on the bottom face of the concave. The light emitting element 10 has a pair of positive and negative electrodes, and the pair of positive and negative electrodes is electrically connected to the first lead 20 and the second lead 30, respectively via a wire 60. The light emitting element 10 is covered by a fluorescent member 50. For example, the fluorescent member 50 contains, as a fluorescent material 70, at least three kinds of a first fluorescent material 71, a second fluorescent material 72, and a third fluorescent material 73 and a resin.

The fluorescent member 50 not only subjects the light emitted by the light emitting element 10 to wavelength conversion but also functions as a member for protecting the light emitting element 10 from the external environment. In FIG. 2, the fluorescent material 70 is unevenly distributed in the fluorescent member 50. In this way, by arranging the fluorescent material 70 close to the light emitting element 10, the light from the light emitting element 10 can be efficiently subjected to wavelength conversion, and a light emitting device with high luminous efficiency can be provided. The arrangement of the fluorescent member 50 including the fluorescent material 70 and the light emitting element 10 is not limited to a mode in which they are arranged close to each other, but taking into consideration any influences of heat against the fluorescent material 70, the light emitting element 10 and the fluorescent material 70 can also be arranged leaving a space in the fluorescent member 50. In addition, by mixing the fluorescent material 70 in a substantially uniform proportion over the whole of the fluorescent member 50, the color unevenness can also be more suppressed.

In FIG. 2, the fluorescent material 70 is constituted such that the first fluorescent material 71, the second fluorescent material 72, and the third fluorescent material 73 are mixed. The second fluorescent material 72 may be arranged on the third fluorescent material 73, and the first fluorescent material 71 may be further arranged thereon. Alternatively, the first fluorescent material 71 may be arranged on the third fluorescent material 73 and the second fluorescent material 72, and the fluorescent material 71, the second fluorescent material 72, and the third fluorescent material 73 may be constituted in an arbitrary arrangement.

Light Emitting Element 10

The light emitting element 10 has a light emission peak wavelength in a range of 440 nm or more and 470 nm or less. From the viewpoint of suppression of the glare or excitation spectra of the fluorescent material, the light emission peak wavelength of the light emitting element 10 is preferably in a range of 440 nm or more and 460 nm or less, and still more preferably in a range of 440 nm or more and 455 nm or less. It is possible to use a part of light of the light emitting element 10 having a light emission peak wavelength in this range as an excitation light of the fluorescent material 70 and to effectively utilize a part of the light of the light emitting element 10 as a part of light to be emitted to the outside, and a light emitting device with high luminous efficiency can be obtained. The light emission peak wavelength of the light emitting element is located on a longer wavelength side than a wavelength of 380 nm or less in a near ultraviolet region, and the light emitting element is low in an ultraviolet ray component, and therefore, it is also excellent as a light source in terms of safety to a human body. The full width at half maximum of the light emission spectra of the light emitting element 10 is preferably 30 nm or less, more preferably 25 nm or less, and still more preferably 20 nm or less. As the light emitting element 10, for example, it is preferred to use a semiconductor light emitting element using a nitride-based semiconductor $(In_XAl_YGa_{1-X-Y}N,$ wherein X and Y are satisfied with $0 \leq X$, $0 \leq Y$, and $(X+Y) \leq 1$). According to this, a stable light emitting device which is high in linearity of an output to an input with high efficiency and is strong to mechanical impact can be obtained.

Fluorescent Member 50

The fluorescent member 50 contains the fluorescent material 70 and at least a resin. The fluorescent member 50 contains the first fluorescent material 71 having a light emission peak wavelength in a range of 480 nm or more and 518 nm or less, the second fluorescent material 72 having a light emission peak wavelength in a range of 510 nm or more and less than 590 nm and having an x value of the chromaticity coordinate in CIE1931 in a range of 0.27 or more and 0.40 or less, and the third fluorescent material 73 having a light emission peak wavelength in a range of 590 nm or more and 670 nm or less by the light emitted from the light emitting element 10. The fluorescent member 50 may contain other fluorescent material than the first fluorescent material, the second fluorescent material, and the third fluorescent material, as the need arises.

First Fluorescent Material 71

The first fluorescent material 71 is excited by the light emitted from the light emitting element 10 and has a light emission peak wavelength in a range of 480 nm or more and 518 nm or less. In the first fluorescent material 71, it is preferred that the light emission peak wavelength by the light emitted from the light emitting element 10 is in a range of 485 nm or more and 516 nm or less. The full width at half maximum in the light emission spectra of the first fluorescent material 71 is 30 nm or more, preferably 40 nm or more, and more preferably 50 nm or more, and it is 80 nm or less, and preferably 70 nm or less. The first fluorescent material in which the light emission peak wavelength is in a range of 480 nm or more and 518 nm or less, and the full width at half maximum in the light emission spectra is 30 nm or more and 80 nm or less is able to enhance the light emission intensity to be excited by the light from the light emitting element.

In the first fluorescent material 71, a relative reflectance to a reflectance of calcium hydrogenphosphate in a range of 380 nm or more and 435 nm or less is, for example, 30% or less, preferably 25% or less, more preferably 20% or less, and still more preferably 16% or less. In addition, a lower limit of the relative reflectance is, for example, 2% or more. When the relative reflectance of the first fluorescent material 71 is 30% or less, a light emitting device in which at least a part of the light having a wavelength of 435 nm or less is efficiently absorbed on the first fluorescent material 71, the light having a wavelength of 435 nm or less which is said to be high in risk of retinal damage is reduced, and the light in the vicinity of 440 nm at which the glare is caused can be constituted. Here, the relative reflectance of the first fluorescent material 71 is measured as a spectral reflectance of the first fluorescent material 71 in the case where a spectral reflectance at each wavelength of 380 nm or more and 435 nm or less of calcium hydrogenphosphate $(CaHPO_4,$ average particle diameter: 2.7 µm) is defined as 100%. In addition, the matter that the relative reflectance is 30% or less means that a maximum value of the relative reflectance in a range of 380 nm or more and 435 nm or less is 30% or less.

From the viewpoint that in the light emission spectra of the light emitting device, a desired light emission intensity is obtained, and light emission spectra capable of reducing the retinal damage or glare are obtained, it is preferred that the first fluorescent material 71 is at least one selected from the group consisting of an alkaline earth metal aluminate fluorescent material and an alkaline earth metal halosilicate fluorescent material. The alkaline earth metal aluminate fluorescent material is, for example, a fluorescent material containing at least strontium and activated with europium and, for example, has a composition represented by the following formula (1A). In addition, the alkaline earth metal halosilicate fluorescent material is, for example, a fluorescent material containing at least calcium and chlorine and activated with europium and, for example, has a composition represented by the following formula (1B). As for the first fluorescent material 71, only one kind may be used, or two or more kinds may be used in combination.

The first fluorescent material 71 is preferably at least one selected from the group consisting of the alkaline earth metal aluminate fluorescent material having a composition represented by the following formula (1A) and the alkaline earth metal halosilicate fluorescent material having a composition represented by the following formula (1B).

$$(Sr_{1-v}M^1_v)_4Al_{14}O_{25}:Eu \quad (1A)$$

In the formula (1A), $M^1$ is at least one element selected from the group consisting of Mg, Ca, Ba, and Zn; and v satisfies $0 \leq v \leq 5$.

$$M^2{}_8MgSi_4O_{16}X^1{}_2:Eu \quad (1B)$$

In the formula (1B), $M^2$ is at least one element selected from the group consisting of Ca, Sr, Ba, and Zn; and $X^1$ is at least one element selected from the group consisting of F, Cl, Br, and I.

An average particle diameter of the first fluorescent material 71 is, for example, in a range of 3 µm or more and 40 µm or less, and preferably in a range of 5 µm or more and 30 µm or less. By regulating the average particle diameter to the lower limit value or more, the light emission intensity of the first fluorescent material excited from the light emitted from the light emitting element 10 can be made large. By regulating the average particle diameter to the upper limit value or less, workability in a production process of the light emitting device can be enhanced.

Though the content $MP_1$ of the first fluorescent material in the fluorescent member 50 may vary with the targeted correlated color temperature, it is, for example, in a range of 5% by mass or more and 70% by mass or less, and preferably in a range of 5% by mass or more and 65% by mass or less relative to the total amount of the first fluorescent material, the second fluorescent material, and the third fluorescent material (hereinafter also referred to simply as "fluorescent material total amount"). When the content $MP_1$ of the first fluorescent material in the fluorescent member 50 falls within the aforementioned range, in the light emission spectra of the light emitting device including the light emitting element, the first fluorescent material, the second fluorescent material, and the third fluorescent material, the wavelength width $I^1{}_{0.3}$ becomes in a predetermined range, and the wavelength width can be widened such that the wavelength width $I^2{}_{0.3}$ becomes in a predetermined range. In addition, when the content $MP_1$ of the first fluorescent material in the fluorescent member 50 falls within the aforementioned range, in the light emission spectra of the light emitting device, the intensity ratio $I_{480}$ can be adjusted such that it becomes high. Furthermore, when the content $MP_1$ of the first fluorescent material in the fluorescent member 50 falls within the aforementioned range, in the light emission spectra of the light emitting device, with respect to the light in the vicinity of 535 nm acting on the M cone, the ratio $I_A/I_B$ can be adjusted such that it becomes in a range of 0.80 or more and 0.96 or less.

The content $MP_1$ of the first fluorescent material in the fluorescent member 50 may vary according to the correlated color temperature of the light emitting device, and in order to provide a light emitting device in which the human eye fatigue under lighting by the light emitting device is reduced and which is excellent in visual workability, the content $MP_1$ of the first fluorescent material in the fluorescent member 50 is, for example, within the following ranges depending upon the correlated color temperature of a mixed light emitted by the light emitting device.

In the case where the correlated color temperature of the light emitting device is in a range of 2,000K or higher and lower than 2,800K, the content $MP_1$ of the first fluorescent material is in a range of 5% by mass or more and 50% by mass or less, preferably in a range of 8% by mass or more and 49% by mass or less, and more preferably in a range of 10% by mass or more and 48% by mass or less relative to the fluorescent material total amount.

In the case where the correlated color temperature of the light emitting device is in a range of 2,800K or higher and lower than 3,500K, the content $MP_1$ of the first fluorescent material is in a range of 5% by mass or more and 50% by mass or less, preferably in a range of 8% by mass or more and 49% by mass or less, and more preferably in a range of 10% by mass or more and 48% by mass or less relative to the fluorescent material total amount.

In the case where the correlated color temperature of the light emitting device is in a range of 3,500K or higher and lower than 4,500K, the content $MP_1$ of the first fluorescent material is in a range of 5% by mass or more and 65% by mass or less, preferably in a range of 8% by mass or more and 64% by mass or less, and more preferably in a range of 10% by mass or more and 63% by mass or less relative to the fluorescent material total amount.

In the case where the correlated color temperature of the light emitting device is in a range of 4,500K or higher and lower than 5,700K, the content $MP_1$ of the first fluorescent material is in a range of 5% by mass or more and 50% by mass or less, preferably in a range of 8% by mass or more and 49% by mass or less, and more preferably in a range of 10% by mass or more and 48% by mass or less relative to the fluorescent material total amount.

In the case where the correlated color temperature of the light emitting device is in a range of 5,700K or higher and 7,200K or lower, the content $MP_1$ of the first fluorescent material is in a range of 5% by mass or more and 50% by mass or less, preferably in a range of 8% by mass or more and 49% by mass or less, and more preferably in a range of 10% by mass or more and 48% by mass or less relative to the fluorescent material total amount.

Second Fluorescent Material 72

The second fluorescent material 72 is excited by the light emitted from the light emitting element 10 and has a light emission peak wavelength in a range of 510 nm or more and less than 590 nm. The second fluorescent material 72 has an x value of the chromaticity coordinate in CIE1931 in a range of 0.27 or more and 0.40 or less, preferably in a range of 0.27 or more and 0.39 or less, and more preferably in a range of 0.27 or more and 0.38 or less. When the x value of the chromaticity coordinate in CIE1931 of the second fluorescent material falls within a range of 0.27 or more and 0.40 or less, in the light emission spectra of the light emitting device in which the light emitting element and other fluorescent materials are combined, the wavelength width can be widened such that the wavelength width $I^1{}_{0.3}$ falls within a predetermined range, and the wavelength width $I^2{}_{0.3}$ falls within a predetermined range. In view of the fact that the wavelength width is widened, the human eye fatigue under lighting by the light emitting device can be reduced, and the human visual work can be efficiently performed. In addition, when the x value in the chromaticity coordinate of the second fluorescent material falls within the aforementioned range, in the light emission spectra of the light emitting device in which the light emitting element and other fluorescent materials are combined, the intensity ratio $I_{480}$ can be adjusted such that it becomes high, and the stimulation to the ipRGC that is a human photoreceptor cell having a peak wavelength in the vicinity of 480 nm is adjusted, thereby making it possible to awaken a human being during visual work and to maintain the ability of concentration. When the intensity ratio $I_{480}$ can be increased, a bluish-green component in the light emission spectra increases, and it becomes possible to compensate a lowering of discrimination of a blue light with age of a human being. Furthermore, when the x value in the chromaticity coordinate of the second fluorescent material falls within the aforementioned range, in the light emission spectra of the light emitting device in which the light emitting element and other fluorescent materials are combined, the ratio $I_A/I_B$ can be adjusted such that it becomes in a range of 0.8 or more and 0.96 or less, and excessive stimulation to the cone is reduced, and the human eye fatigue to be caused due to the glare in not only photopic vision but also mesopic vision is reduced, whereby the human eye fatigue can be more reduced.

In the second fluorescent material 72, the light emission peak wavelength by the light emitted from the light emitting element 10 is in a range of 510 nm or more and less than 590 nm, and preferably in a range of 510 nm or more and 550 nm or less. The full width at half maximum in the light emission spectra of the second fluorescent material 72 is, for example, 20 nm or more, preferably 40 nm or more, and more preferably 50 nm or more, and it is, for example, 120 nm or less, preferably 110 nm or less, and more preferably 105 nm or less. The second fluorescent material in which the light emission peak wavelength is in a range of 510 nm or more and less than 590 nm, and the full width at half maximum in the light emission spectra is 20 nm or more and 120 nm or less is able to enhance the light emission intensity to be excited by the light from the light emitting element.

From the viewpoint that the x value of the chromaticity coordinate of CIE1931 falls within the aforementioned range, the desired light emission intensity in the light emission spectra of the light emitting device is obtained, and light emission spectra capable of reducing the retinal damage or glare are obtained, for example, the second fluorescent material 72 is preferably at least one selected from the group consisting of a β-SiALON fluorescent material, an aluminate fluorescent material, a sulfide fluorescent material, a scandium-based fluorescent material, an alkaline earth metal silicate fluorescent material, and a lanthanoid silicon nitride fluorescent material. As for the second fluorescent material 72, only one kind may be used, or two or more kinds may be used in combination.

The second fluorescent material 72 is preferably an aluminate fluorescent material having a composition represented by the following formula (2A).

$$(Ln_{1-a}Ce_a)_3(Al_{1-b}Ga_b)_5O_{12} \qquad (2A)$$

In the formula (2A), Ln is at least one element selected from the group consisting of Y, Gd, Lu, and Tb; and a and b each satisfy $0.001 \leq a \leq 0.20$ and $0 \leq b \leq 1.0$.

The second fluorescent material 72 may also be at least one selected from the group consisting of a β-SiALON fluorescent material having a composition represented by the following formula (2B); a sulfide fluorescent material having a composition represented by the following formula (2C) or (2D); a scandium-based fluorescent material having a composition represented by the following formula (2E); an alkaline earth metal silicate fluorescent material having a composition represented by the following formula (2F) or (2G); and a lanthanoid silicon nitride fluorescent material having a composition represented by the following formula (2H).

$$Si_{6-e}Al_eO_eN_{8-e}:Eu \ (0<e\leq4.2) \qquad (2B)$$

$$(Sr,M^3)Ga_2S_4:Eu \qquad (2C)$$

$$(Sr_{1-f-g}M^3{}_fEu_g)Ga_2S_4 \qquad (2D)$$

In the formula (2C) or (2D), $M^3$ represents at least one element selected from the group consisting of Be, Mg, Ca, Ba, and Zn. In the formula (2D), f and g each satisfy $0.03 \leq f \leq 0.25$, $0 \leq g < 0.97$, and $(f+g)<1$.

$$(Ca,Sr)Sc_2O_4:Ce \qquad (2E)$$

$$(Ca,Sr)_3(Sc,Mg)_2Si_3O_{12}:Ce \qquad (2F)$$

$$(Ca,Sr,Ba)_2SiO_4:Eu \qquad (2G)$$

$$(La,Y,Gd)_3Si_6N_{11}:Ce \qquad (2H)$$

In this specification, in the composition formula, the plural elements described as being separated by the comma (,) mean that at least one element of these plural elements is contained in the composition. The plural elements described as being separated by the comma (,) in the composition formula may contain at least one element selected from the plural elements as being separated by the comma in the composition or may contain a combination of two or more from the plural elements. In this specification, in the formula representing the composition of the fluorescent material, the front of the colon (:) represents a host crystal, and the back of the colon (:) represents an activation element.

An average particle diameter of the second fluorescent material 72 is, for example, in a range of 1 μm or more and 40 μm or less, and preferably in a range of 5 μm or more and 30 μm or less. When the average particle diameter is the aforementioned lower limit value or more, the light emission intensity of the second fluorescent material excited from the light emitted from the light emitting element 10 can be made large. When the average particle diameter is the aforementioned upper limit value or less, workability in a production process of the light emitting device can be enhanced.

Though the content $MP_2$ of the second fluorescent material in the fluorescent member 50 may vary with the targeted correlated color temperature, it is, for example, in a range of 30% by mass or more and 90% by mass or less, and preferably in a range of 32% by mass or more and 85% by mass or less relative to the fluorescent material total amount. When the content $MP_2$ of the second fluorescent material in the fluorescent member 50 falls within the aforementioned range, in the light emission spectra of the light emitting device in which the light emitting element and other fluorescent materials are combined, the wavelength width $I^1{}_{0.3}$ becomes in a predetermined range, and the wavelength width can be widened such that the wavelength width $I^2{}_{0.3}$ becomes in a predetermined range. In addition, when the content $MP_2$ of the second fluorescent material in the fluorescent member 50 falls within the aforementioned range, in the light emission spectra of the light emitting device in which the light emitting element and other fluorescent materials are combined, the intensity ratio $I_{480}$ can be adjusted such that it becomes high. Furthermore, when the content $MP_2$ of the second fluorescent material in the fluorescent member 50 falls within the aforementioned range, in the light emission spectra of the light emitting device in which the light emitting element and other fluorescent materials are combined, the ratio $I_A/I_B$ can be adjusted such that it becomes in a range of 0.8 or more and 0.96 or less.

The content $MP_2$ of the second fluorescent material in the fluorescent member 50 may vary according to the correlated color temperature of the light emitting device, and in order to provide a light emitting device in which the human eye fatigue under lighting by the light emitting device is reduced and which is excellent in visual workability, the content $MP_2$ of the second fluorescent material in the fluorescent member 50 is, for example, within the following ranges depending upon the correlated color temperature of a mixed light emitted by the light emitting device.

In the case where the correlated color temperature of the light emitting device is in a range of 2,000K or higher and lower than 2,800K, the content $MP_2$ of the second fluorescent material is in a range of 40% by mass or more and 90% by mass or less, preferably in a range of 41% by mass or more and 89% by mass or less, and more preferably in a range of 42% by mass or more and 88% by mass or less relative to the fluorescent material total amount.

In the case where the correlated color temperature of the light emitting device is in a range of 2,800K or higher and lower than 3,500K, the content $MP_2$ of the second fluorescent material is in a range of 40% by mass or more and 90% by mass or less, preferably in a range of 41% by mass or more and 89% by mass or less, and more preferably in a range of 42% by mass or more and 88% by mass or less relative to the fluorescent material total amount.

In the case where the correlated color temperature of the light emitting device is in a range of 3,500K or higher and lower than 4,500K, the content $MP_2$ of the second fluorescent material is in a range of 30% by mass or more and 85% by mass or less, preferably in a range of 31% by mass or more and 84% by mass or less, and more preferably in a range of 32% by mass or more and 82% by mass or less relative to the fluorescent material total amount.

In the case where the correlated color temperature of the light emitting device is in a range of 4,500K or higher and lower than 5,700K, the content $MP_2$ of the second fluorescent material is in a range of 40% by mass or more and 80% by mass or less, preferably in a range of 41% by mass or more and 79% by mass or less, and more preferably in a range of 42% by mass or more and 78% by mass or less relative to the fluorescent material total amount.

In the case where the correlated color temperature of the light emitting device is in a range of 5,700K or higher and 7,200K or lower, the content $MP_2$ of the second fluorescent material is in a range of 40% by mass or more and 80% by mass or less, preferably in a range of 41% by mass or more and 79% by mass or less, and more preferably in a range of 42% by mass or more and 78% by mass or less relative to the fluorescent material total amount.

Third Fluorescent Material 73

The third fluorescent material 73 is excited by the light emitted from the light emitting element 10 and has a light emission peak wavelength in a range of 590 nm or more and 670 nm or less. In the third fluorescent material 73, it is preferred that the light emission peak wavelength by the light emitted from the light emitting element is in a range of 590 nm or more and 630 nm or less. The full width at half maximum in the light emission spectra of the third fluorescent material 73 is 5 nm or more, preferably 6 nm or more, and more preferably 10 nm or more, and it is 100 nm or less, preferably 95 nm or less, and more preferably 90 nm or less. The third fluorescent material 73 in which the light emission peak wavelength is in a range of 590 nm or more and 670 nm or less, and the full width at half maximum in the light emission spectra is 5 nm or more and 100 nm or less is able to enhance the light emission intensity to be excited by the light from the light emitting element.

From the viewpoint that in the light emission spectra of the light emitting device, a desired light emission intensity is obtained, and light emission spectra capable of reducing the retinal damage or glare are obtained, it is preferred that the third fluorescent material 73 is, for example, at least one selected from the group consisting of a silicon nitride-based fluorescent material, an alkaline earth metal silicon nitride-based fluorescent material, an α-SiALON fluorescent material, a fluoride fluorescent material, a fluorogermanate fluorescent material, and a sulfide fluorescent material. As for the third fluorescent material 73, only one kind may be used, or two or more kinds may be used in combination.

The third fluorescent material 73 is preferably at least one fluorescent material selected from an alkaline earth metal silicon nitride fluorescent material having a composition represented by the following formula (3A) or (3B) and an α-SiALON fluorescent material having a composition represented by the following formula (3C).

$$(Ca_{1-p}Sr_p)AlSiN_3:Eu \quad (3A)$$

In the formula (3A), p satisfies $0 \leq p \leq 1.0$.

$$(Ca_{1-q-r}Sr_qBa_r)_2Si_5N_8:Eu \quad (3B)$$

In the formula (3B), q and r each satisfy $0 \leq q \leq 1.0$, $0 \leq r \leq 1.0$, and $(q+r) \leq 1.0$.

$$M^4{}_kSi_{12-(m+n)}Al_{m+n}O_nN_{16-n}:Eu \quad (3C)$$

In the formula (3C), $M^4$ is at least one element selected from the group consisting of Li, Mg, Ca, Sr, Y, and a lanthanoid element (provided that La and Ce are excluded); and k, m, and n each satisfy $0<k \leq 2.0$, $2.0 \leq m \leq 6.0$, and $0 \leq n \leq 1.0$.

The third fluorescent material 73 may also be at least one selected from the group consisting of a fluoride fluorescent material having a composition represented by the following formula (3D) or (3d), a fluorogermanate fluorescent material having a composition represented by the following formula (3E) or (3e), a silicon nitride-based fluorescent material having a composition represented by the following formula (3F) or (3f), and a sulfide fluorescent material having a composition represented by the following formula (3G).

$$A_2[M^5F_6]:Mn \quad (3D)$$

$$A_2[M^5{}_{1-a1}Mn_{a1}F_6] \quad (3d)$$

In the formula (3D) or formula (3d), A is at least one selected from the group consisting of an alkali metal and an ammonium and preferably contains at least potassium. $M^5$ is at least one element selected from the group consisting of a Group 4 element and a Group 14 element and preferably contains at least one element selected from the group consisting of silicon, germanium, and titanium. a1 satisfies $0.01<a1<0.2$.

$$(i\text{-}j)MgO.(j/2)Sc_2O_3.hMgF_2.sCaF_2.(1\text{-}t)GeO_2.(t/2)M^6{}_2O_3:Mn \quad (3E)$$

$$(i\text{-}j)MgO.(j/2)Sc_2O_3.hMgF_2.sCaF_2.(1\text{-}t)GeO_2.(t/2)M^6{}_2O_3:uMn \quad (3e)$$

In the formula (3E) or formula (3e), $M^6$ is at least one element selected from the group consisting of Al, Ga, and In. i, j, h, s, and t each satisfy $2 \leq i \leq 4$, $0 \leq j<0.5$, $0<h<1.5$, $0 \leq s<1.5$, and $0<t<0.5$. u satisfies $0<u<0.05$.

$$M^7{}_{b1}M^8{}_{c1}Al_{3-e1}Si_{e1}N_{f1}:M^9 \quad (3F)$$

$$M^7{}_{b1}M^8{}_{c1}M^9{}_{d1}Al_{3-e1}Si_{e1}N_{f1} \quad (3f)$$

In the formula (3F) or formula (3f), $M^7$ is at least one element selected from the group consisting of Ca, Sr, Ba, and Mg; $M^8$ is at least one element selected from the group consisting of Li, Na, and K; $M^9$ is at least one element selected from the group consisting of Eu, Ce, Tb, and Mn; b1, c1, d1, e1, and f1 each satisfy $0.80 \leq b1 \leq 1.05$, $0.80 \leq c1 \leq 1.05$, $0.001<d1 \leq 0.1$, $0 \leq e1 \leq 0.5$, and $3.0 \leq f1 \leq 5.0$.

$$(Ca,Sr)S:Eu \quad (3G)$$

An average particle diameter of the third fluorescent material 73 is, for example, in a range of 1 µm or more and 40 µm or less, and preferably in a range of 5 µm or more and 30 µm or less. When the average particle diameter is the aforementioned lower limit value or more, the light emission intensity of the third fluorescent material excited from the light emitted from the light emitting element 10 can be made large. When the average particle diameter is the aforementioned upper limit value or less, workability in a production process of the light emitting device can be enhanced.

Though the content (% by mass) $MP_3$ of the third fluorescent material in the fluorescent member 50 may vary with the targeted correlated color temperature and also may vary with the content $MP_1$ of the first fluorescent material and the content $MP_2$ of the second fluorescent material in the fluorescent member 50, it is, for example, in a range of 0.5% by mass or more and 20% by mass or less, and preferably in a range of 1.0% by mass or more and 15% by mass or less relative to the fluorescent material total amount. When the content $MP_3$ of the third fluorescent material in the fluorescent member 50 falls within the aforementioned range, in the light emission spectra of the light emitting device in which the light emitting element and other fluorescent materials are combined, the wavelength width $I^1_{0.3}$ becomes in a predetermined range, and the wavelength width can be widened such that the wavelength width $I^2_{0.3}$ becomes in a predetermined range. In addition, when the content $MP_3$ of the third fluorescent material in the fluorescent member 50 falls within the aforementioned range, in the light emission spectra of the light emitting device in which the light emitting element and other fluorescent materials are combined, the intensity ratio $I_{480}$ can be adjusted such that it becomes high. Furthermore, when the content $MP_3$ of the third fluorescent material in the fluorescent member 50 falls within the aforementioned range, in the light emission spectra of the light emitting device in which the light emitting element and other fluorescent materials are combined, the ratio $I_A/I_B$ can be adjusted such that it becomes in a range of 0.8 or more and 0.96 or less.

The content $MP_3$ of the third fluorescent material in the fluorescent member 50 may vary according to the correlated color temperature of the light emitting device and the content $MP_1$ of the first fluorescent material and the content $MP_2$ of the second fluorescent material, and in order to provide a light emitting device in which the human eye fatigue under lighting by the light emitting device is reduced and which is excellent in visual workability, the content $MP_3$ of the third fluorescent material in the fluorescent member 50 is, for example, within the following ranges depending upon the correlated color temperature of a mixed light emitted by the light emitting device.

In the case where the correlated color temperature of the light emitting device is in a range of 2,000K or higher and lower than 2,800K, the content $MP_3$ of the third fluorescent material is in a range of 1% by mass or more and 10% by mass or less, preferably in a range of 1% by mass or more and 9% by mass or less, and more preferably in a range of 1% by mass or more and 8% by mass or less relative to the fluorescent material total amount.

In the case where the correlated color temperature of the light emitting device is in a range of 2,800K or higher and lower than 3,500K, the content $MP_3$ of the third fluorescent material is in a range of 1% by mass or more and 10% by mass or less, preferably in a range of 1% by mass or more and 9% by mass or less, and more preferably in a range of 1% by mass or more and 8% by mass or less relative to the fluorescent material total amount.

In the case where the correlated color temperature of the light emitting device is in a range of 3,500K or higher and lower than 4,500K, the content $MP_3$ of the third fluorescent material is in a range of 1% by mass or more and 15% by mass or less, preferably in a range of 1% by mass or more and 14% by mass or less, and more preferably in a range of 1% by mass or more and 13% by mass or less relative to the fluorescent material total amount.

In the case where the correlated color temperature of the light emitting device is in a range of 4,500K or higher and lower than 5,700K, the content $MP_3$ of the third fluorescent material is in a range of 1% by mass or more and 15% by mass or less, preferably in a range of 1% by mass or more and 14% by mass or less, and more preferably in a range of 1% by mass or more and 13% by mass or less relative to the fluorescent material total amount.

In the case where the correlated color temperature of the light emitting device is in a range of 5,700K or higher and 7,200K or lower, the content $MP_3$ of the third fluorescent material is in a range of 1% by mass or more and 15% by mass or less, preferably in a range of 1% by mass or more and 14% by mass or less, and more preferably in a range of 1% by mass or more and 13% by mass or less relative to the fluorescent material total amount.

The content of each of the first fluorescent material 71, the second fluorescent material 72, and the third fluorescent material 73 contained in the fluorescent material 70 in the fluorescent member 50 is, for example, the aforementioned range and may be properly selected according to the correlated color temperature and so on. In addition, the total content of the fluorescent material 70 in the fluorescent member 50 is, for example, in a range of 10% by mass or more and 280% by mass or less, preferably in a range of 20% by mass or more and 270% by mass or less, and more preferably in a range of 30% by mass or more and 260% by mass or less relative to the resin contained in the fluorescent member 50.

A mass ratio of the second fluorescent material to the first fluorescent material to be contained in the fluorescent member 50 ((second fluorescent material)/(first fluorescent material)) may vary with the correlated color temperature of the light emitting device as follows.

In the case where the correlated color temperature of the light emitting device is in a range of 2,000K or higher and lower than 2,800K, the mass ratio of the second fluorescent material to the first fluorescent material ((second fluorescent material)/(first fluorescent material)) is preferably in a range of 0.1 or more and 10 or less, and more preferably in a range of 0.2 or more and 9.9 or less.

In the case where the correlated color temperature of the light emitting device is in a range of 2,800K or higher and lower than 3,500K, the mass ratio of the second fluorescent material to the first fluorescent material ((second fluorescent material)/(first fluorescent material)) is preferably in a range of 0.1 or more and 10 or less, and more preferably in a range of 0.2 or more and 9.9 or less.

In the case where the correlated color temperature of the light emitting device is in a range of 3,500K or higher and lower than 4,500K, the mass ratio of the second fluorescent material to the first fluorescent material ((second fluorescent material)/(first fluorescent material)) is preferably in a range of 0.1 or more and 7 or less, and more preferably in a range of 0.2 or more and 6.9 or less.

In the case where the correlated color temperature of the light emitting device is in a range of 4,500K or higher and lower than 5,700K, the mass ratio of the second fluorescent material to the first fluorescent material ((second fluorescent material)/(first fluorescent material)) is preferably in a range of 0.5 or more and 5 or less, and more preferably in a range of 0.6 or more and 4.5 or less.

In the case where the correlated color temperature of the light emitting device is in a range of 5,700K or higher and 7,200K or lower, the mass ratio of the second fluorescent material to the first fluorescent material ((second fluorescent material)/(first fluorescent material)) is preferably in a range of 0.5 or more and 10 or less, and more preferably in a range of 0.6 or more and 9.5 or less.

A mass ratio of the third fluorescent material to the first fluorescent material to be contained in the fluorescent member 50 ((third fluorescent material)/(first fluorescent material)) may vary with the correlated color temperature of the light emitting device as follows.

In the case where the correlated color temperature of the light emitting device is in a range of 2,000K or higher and lower than 2,800K, the mass ratio of the third fluorescent material to the first fluorescent material ((third fluorescent material)/(first fluorescent material)) is preferably in a range of 0.05 or more and 0.5 or less, and more preferably in a range of 0.06 or more and 0.49 or less.

In the case where the correlated color temperature of the light emitting device is in a range of 2,800K or higher and lower than 3,500K, the mass ratio of the third fluorescent material to the first fluorescent material ((third fluorescent material)/(first fluorescent material)) is preferably in a range of 0.05 or more and 0.5 or less, and more preferably in a range of 0.06 or more and 0.49 or less.

In the case where the correlated color temperature of the light emitting device is in a range of 3,500K or higher and lower than 4,500K, the mass ratio of the third fluorescent material to the first fluorescent material ((third fluorescent material)/(first fluorescent material)) is preferably in a range of 0.05 or more and 0.5 or less, and more preferably in a range of 0.06 or more and 0.49 or less.

In the case where the correlated color temperature of the light emitting device is in a range of 4,500K or higher and lower than 5,700K, the mass ratio of the third fluorescent material to the first fluorescent material ((third fluorescent material)/(first fluorescent material)) is preferably in a range of 0.05 or more and 1.0 or less, and more preferably in a range of 0.06 or more and 0.9 or less.

In the case where the correlated color temperature of the light emitting device is in a range of 5,700K or higher and 7,200K or lower, the mass ratio of the third fluorescent material to the first fluorescent material ((third fluorescent material)/(first fluorescent material)) is preferably in a range of 0.05 or more and 1.5 or less, and more preferably in a range of 0.06 or more and 1.4 or less.

A mass ratio of the third fluorescent material to the second fluorescent material to be contained in the fluorescent member 50 ((third fluorescent material)/(second fluorescent material)) may vary with the correlated color temperature of the light emitting device as follows.

In the case where the correlated color temperature of the light emitting device is in a range of 2,000K or higher and lower than 2,800K, the mass ratio of the third fluorescent material to the second fluorescent material ((third fluorescent material)/(second fluorescent material)) is preferably in a range of 0.01 or more and 0.2 or less, and more preferably in a range of 0.02 or more and 0.19 or less.

In the case where the correlated color temperature of the light emitting device is in a range of 2,800K or higher and lower than 3,500K, the mass ratio of the third fluorescent material to the second fluorescent material ((third fluorescent material)/(second fluorescent material)) is preferably in a range of 0.01 or more and 0.2 or less, and more preferably in a range of 0.02 or more and 0.19 or less.

In the case where the correlated color temperature of the light emitting device is in a range of 3,500K or higher and lower than 4,500K, the mass ratio of the third fluorescent material to the second fluorescent material ((third fluorescent material)/(second fluorescent material)) is preferably in a range of 0.01 or more and 0.3 or less, and more preferably in a range of 0.02 or more and 0.29 or less.

In the case where the correlated color temperature of the light emitting device is in a range of 4,500K or higher and lower than 5,700K, the mass ratio of the third fluorescent material to the second fluorescent material ((third fluorescent material)/(second fluorescent material)) is preferably in a range of 0.01 or more and 0.4 or less, and more preferably in a range of 0.01 or more and 0.39 or less.

In the case where the correlated color temperature of the light emitting device is in a range of 5,700K or higher and 7,200K or lower, the mass ratio of the third fluorescent material to the second fluorescent material ((third fluorescent material)/(second fluorescent material)) is preferably in a range of 0.01 or more and 0.5 or less, and more preferably in a range of 0.01 or more and 0.4 or less.

Resin

The fluorescent member 50 can contain, in addition to the fluorescent material 70, at least one resin. The resin may be either a thermoplastic resin or a thermosetting resin. Specifically, examples of the thermosetting resin include an epoxy resin and a silicone resin.

Other Component

The fluorescent member 50 may contain, in addition to the fluorescent material 70 and the resin, other component as the need arises. Examples of the other component include a filler, such as silica, barium titanate, titanium oxide, and aluminum oxide, a light stabilizer, and a colorant. In the case where the fluorescent member contains, for example, a filler as the other component, its content can be 0.01% by mass to 20% by mass relative to the resin.

As for the light emitting device, its general color rendering index Ra is preferably 80 or more. The general color rendering index Ra is more preferably 81 or more, and still more preferably 82 or more. The general color rendering index Ra of the light emitting device can be measured in conformity with JIS Z8726. As a value of the general color rendering index Ra of the light emitting device becomes closer to 100, the color rendering property close to a reference light source is revealed. In a general indoor lighting application, it may be said that the general color rendering index Ra is preferably 80 or more. In addition, in the case where a visual performance of strict colors for color inspection, lighting in an art gallery or a museum, and so on, it may be said that the general color rendering index Ra is preferably 90 or more.

As for the light emitting device, its special color rendering index R9 may be −20 to 40 and may also be −15 to 35. The special color rendering index R9 is an index expressing a red color.

When the content $MP_1$ of the first fluorescent material and the content $MP_2$ of the second fluorescent material relative to the fluorescent material total amount are adjusted to the aforementioned ranges, respectively, a light emitting device capable of reducing the fatigue and having light emission spectra with excellent visual workability can be provided. For example, the light emission spectra of the light emitting device may have a first peak wavelength $P_t1$ in a range of 440 nm or more and 470 nm or less, have a second peak wavelength $P_t2$ in a range of 490 nm or more and 520 nm or less, and have a third peak wavelength $P_t3$ in a range of 570 nm or more and 650 nm or less. In addition, the light emitting spectra may have a first minimum value T1 between the first peak wavelength and the second peak wavelength and a second minimum value T2 between the second peak wavelength and the third peak wavelength. The first maximum value $P_t1$ is, for example, derived from a mixed light of the light emitted by the light emitting element and the light emitted by the first fluorescent material. The second maximum value $P_r2$ is, for example, derived from the light emitted by the first fluorescent material and the light emitted by the second fluorescent material. And the third maximum value $P_r3$ is, for example, derived from the light emitted by the second fluorescent material and the light emitted by the third fluorescent material. In the case where plural maximum values exist in a predetermined wavelength range, one having the highest light emission intensity is defined as the maximum value in the foregoing range, and in the case where plural minimum values exist in a predetermined wavelength range, one having the lowest light emission intensity is defined as the minimum value in the foregoing range.

Here, the maximum value and the minimum value in the light emission spectra each mean the light emission intensity in a wavelength at which a change rate of the light emission intensity to the wavelength is 0, and the case where a value of the change rate of the light emission intensity to the wavelength in front and behind that wavelength changes from positive to negative is defined as the maximum value, whereas the case where it changes from negative to positive is defined as the minimum value. Even in the case where the change rate of the light emission intensity to the wavelength is 0, the case where the positive and negative of the value of the change rate of the light emission intensity to the wavelength does not change in front of and behind that wavelength is not considered to be the maximum value or minimum value. That is, the light emission spectra have an upward convex shape in the vicinity of the maximum value and have a downward convex shape in the vicinity of the minimum value.

Lighting Fixture

The lighting fixture according to the second embodiment of the present disclosure may be provided with at least one of the aforementioned light emitting device. The lighting fixture is constituted by being provided with the aforementioned light emitting device, and it may be further provided with a reflecting member, a protecting member, an attachment device for supplying electricity to the light emitting device, and so on. The lighting fixture may be provided with plural light emitting devices. In the case where the lighting fixture is provided with plural light emitting devices, plural identical light emitting devices may be provided, and for example, light emitting devices having a different correlated color temperature from each other may also be provided. In addition, a drive unit which drives individually the plural light emitting devices and is able to adjust the brightness or correlated color temperate according to preference may also be provided. A form of use of the lighting fixture may be any of a direct attaching type, an embedding type, and a pendant type.

EXAMPLES

The present disclosure is hereunder specifically described by reference to Examples. It should be construed that the present disclosure is by no means limited to these Examples.

For the light emitting device of each of the Examples and Comparative Examples, the following first fluorescent material, second fluorescent material, and third fluorescent material were used.

First Fluorescent Material 71

As the first fluorescent material, an alkaline earth metal aluminate fluorescent material having a composition represented by the following formula (1a) (hereinafter also referred to as "SAE") and an alkaline earth metal chlorosilicate fluorescent material having a composition represented by the following formula (1b) (hereinafter also referred to as "CMSC") were prepared.

$$(Sr_{0.825}Eu_{0.175})_4Al_{14}O_{25} \qquad (1a)$$

With respect to SAE, reflection spectra in a range of 380 nm or more and 730 nm or less at room temperature (25° C.) were measured with a fluorescence spectrophotometer (F-4500, manufactured by Hitachi High-Technologies Corporation). Calcium hydrogenphosphate ($CaHPO_4$) was used for a reference sample. In the reflection spectra of SAE exhibiting the relative intensity (reflectance) (%) at each wavelength in the case of defining a reflectance of the reference sample at each wavelength as 100%, a maximum value of the relative intensity (reflectance) in a range of 380 nm or more and 435 nm or less was 8.9%. In addition, as a result of measuring the light emission spectra of SAE measured by a method as mentioned later, a light emission peak wavelength was 495 nm, and a full width at half maximum was 60 nm.

$$Ca_{7.7}MgSi_4O_{16}Cl_2:Eu_{0.3} \qquad (1b)$$

With respect to CMSC, reflection spectra in a range of 380 nm or more and 730 nm or less at room temperature (25° C.) were measured with a fluorescence spectrophotometer (F-4500, manufactured by Hitachi High-Technologies Corporation). Calcium hydrogenphosphate ($CaHPO_4$) was used for a reference sample. In the reflection spectra of CMSC exhibiting the relative intensity (reflectance) (%) at each wavelength in the case of defining a reflectance of the reference sample at each wavelength as 100%, a maximum value of the relative intensity (reflectance) in a range of 380 nm or more and 435 nm or less was 9.9%. In addition, as a result of measuring the light emission spectra of CMSC measured by a method as mentioned later, a light emission peak wavelength was 515 nm, and a full width at half maximum was 58 nm.

Measurement of Light Emission Spectra of Fluorescent Material

Each of the first fluorescent material 71, the second fluorescent material 72, and the third fluorescent material 73 was irradiated with a light having an excitation wavelength of 450 nm by using a quantum efficiency measurement system (QE-2000, manufactured by Otsuka Electronics Co., Ltd.) to measure the light emission spectra at room temperature (about 25° C.), and the light emission peak and the full width at half maximum of each of the fluorescent materials were measured.

Second Fluorescent Material 72

An aluminate fluorescent material (YAG1) having a composition represented by the aforementioned formula (2A) and having an x value in the chromaticity coordinate of CIE1931 of more than 0.40 and each of aluminate fluorescent materials (GYAG2, LAG3, GYAG4, LAG5, GLAG6, and GLAG7) having a composition represent by the aforementioned formula (2A), in which elements to be contained in the composition were selected, and a molar ratio thereof was adjusted such that the x value in the chromaticity coordinate of CIE1931 was in a range of 0.27 or more and 0.40 or less, were prepared. The light emission spectra of each of the second fluorescent materials were measured by the aforementioned method, and the light emission peak and the full width at half maximum were measured. In addition, the x value of the chromaticity coordinate in CIE1931 of each of the second fluorescent materials was measured by using a quantum efficiency measurement system (QE-2000, manufactured by Otsuka Electronics Co., Ltd.). The results are shown in the following Table 1.

TABLE 1

| Second fluorescent material | Light emission peak wavelength (nm) | Chromaticity x | Full width at half maximum (nm) |
|---|---|---|---|
| YAG1 | 550 | 0.429 | 110 |
| GYAG2 | 538 | 0.395 | 107 |
| LAG3 | 544 | 0.379 | 102 |
| GYAG4 | 534 | 0.376 | 106 |
| LAG5 | 530 | 0.339 | 101 |
| GLAG6 | 518 | 0.319 | 100 |
| GLAG7 | 516 | 0.282 | 97 |

Third Fluorescent Material 73

Each of alkaline earth metal silicon nitride fluorescent materials (SCASN1, SCASN2, SCASN3, SCASN4, and SCASN5) having a composition represent by the aforementioned formula (3A), in which elements to be contained in the composition were selected, and a molar ratio thereof was adjusted so as to have different light emission peak wavelength and full width at half maximum from each other, and an alkaline earth metal silicon nitride fluorescent material (BSESN6) having a composition represented by the aforementioned formula (3B), in which elements to be contained in the composition were selected, and a molar ratio thereof was adjusted so as to have predetermined values of light emission peak wavelength and full width at half maximum. The light emission spectra of each of the third fluorescent materials were measured by the aforementioned method, and the light emission peak and the full width at half maximum were measured. The results are shown in the following Table 2.

TABLE 2

| Third fluorescent material | Light emission peak wavelength (nm) | Full width at half maximum (nm) |
|---|---|---|
| SCASN1 | 608 | 74 |
| SCASN2 | 615 | 74 |
| SCASN3 | 620 | 74 |
| SCASN4 | 625 | 77 |
| SCASN5 | 630 | 80 |
| BSESN6 | 605 | 84 |

Example 1

The fluorescent material 70 in which the first fluorescent material 71, the second fluorescent material 72, and the third fluorescent material 73 were blended such that the chromaticity coordinate in CIE1931 was located in the vicinity of X=0.312 and Y=0.328, and a silicone resin were mixed and dispersed, and the dispersion was then degassed to obtain a resin composition for fluorescent member. The fluorescent material total amount in the resin composition for fluorescent member was 68.6% by mass based on 100% by mass of the resin. In addition, the content $MP_1$ of SAE that is the first fluorescent material 71 was 43.7% by mass, the content $MP_2$ of LAG3 that is the second fluorescent material 72 was 45.8% by mass, and the content $MP_3$ of SCASN1 that is the third fluorescent material 73 was 10.5% by mass relative to the fluorescent material total amount. Next, the molded article 40 having a convex as shown in FIG. 2 was prepared; the light emitting element 10 having a light emission peak wavelength of 450 nm on the bottom face of the convex and having a gallium nitride-based compound semiconductor was arranged in the first lead 20; and the resin composition for fluorescent member was injected onto and filled in the light emitting element 10, followed by heating to cure the resin composition. The full width at half maximum of the light emission spectra of the light emitting element 10 was 15 nm. A light emitting device of Example 1 was fabricated through these steps. The aforementioned chromaticity coordinate is about 6,500K in terms of the correlated color temperature of the light emitting device and is corresponding to a range where the correlated color temperature is 5,700K or higher and 7,200K or lower.

Examples 2 to 5, and 23, and Comparative Examples 1, 2 and 11

Light emitting devices were fabricated in the same manner as in Example 1, except for changing the kinds of the first fluorescent material 71, the second fluorescent material 72, and the third fluorescent material 73 and the content of each of the fluorescent materials relative to the fluorescent material total amount as shown in the following Table 3.

TABLE 3

| | Fluorescent material content (% by mass) | | | | Fluorescent material | | |
|---|---|---|---|---|---|---|---|
| | First fluorescent material $MP_1$ | Second fluorescent material $MP_2$ | Third fluorescent material $MP_3$ | Content relative to resin (% by mass) | First fluorescent material | Second fluorescent material | Third fluorescent material |
| Comparative Example 1 | 14.5 | 83.2 | 2.3 | 48.2 | SAE | YAG1/LAG3 (70/30) | SCASN3/SCASN4 (50/50) |
| Comparative Example 2 | 71.8 | 18.4 | 9.9 | 69.7 | SAE | YAG1 | SCASN1 |
| Example 1 | 43.7 | 45.8 | 10.5 | 68.6 | SAE | LAG3 | SCASN1 |
| Example 2 | 37.2 | 53.2 | 9.5 | 80.6 | SAE | LAG5 | SCASN1 |
| Example 3 | 36.1 | 54.2 | 9.7 | 83.1 | SAE | GLAG6 | SCASN1 |
| Example 4 | 24.3 | 66.1 | 9.6 | 82.3 | SAE | GLAG6 | SCASN1 |
| Example 5 | 13.1 | 77.3 | 9.6 | 76.3 | SAE | GLAG6 | SCASN1 |
| Example 23 | 24.0 | 73.8 | 2.3 | 83.5 | SAE | GLAG6 | SCASN4/SCASN5 (75/25) |
| Comparative Example 11 | 27.1 | 66.4 | 6.4 | 29.8 | CMSC | GYAG2 | SCASN5 |

Examples 6 to 10, and 24, and Comparative Examples 3, 4 and 12

Light emitting devices were fabricated in the same manner as in Example 1, except for blending the first fluorescent material 71, the second fluorescent material 72, and the third fluorescent material 73 such that the chromaticity coordinate in CIE1931 was located in the vicinity of X=0.345 and Y=0.355; and changing the kinds of the first fluorescent material 71, the second fluorescent material 72, and the third fluorescent material 73 and the content of each of the fluorescent materials relative to the fluorescent material total amount as shown in the following Table 4. The aforementioned chromaticity coordinate is about 5,000K in terms of the correlated color temperature of the light emitting device and is corresponding to a range where the correlated color temperature is 4,500K or higher and lower than 5,700K.

TABLE 4

|  | Fluorescent material content (% by mass) | | | Content | Fluorescent material | | |
|---|---|---|---|---|---|---|---|
|  | First fluorescent material $MP_1$ | Second fluorescent material $MP_2$ | Third fluorescent material $MP_3$ | relative to resin (% by mass) | First fluorescent material | Second fluorescent material | Third fluorescent material |
| Comparative Example 3 | 19.8 | 77.7 | 2.5 | 81.0 | SAE | YAG1/LAG3 (70/30) | SCASN3/SCASN4 (50/50) |
| Comparative Example 4 | 63.0 | 26.3 | 10.7 | 95.2 | SAE | YAG1 | SCASN1 |
| Example 6 | 38.8 | 49.6 | 11.6 | 103.1 | SAE | LAG3 | SCASN1 |
| Example 7 | 27.6 | 62.4 | 10.0 | 144.8 | SAE | LAG5 | SCASN1 |
| Example 8 | 31.9 | 58.0 | 10.1 | 125.3 | SAE | GLAG6 | SCASN1 |
| Example 9 | 22.8 | 69.8 | 7.5 | 175.6 | SAE | GLAG7 | SCASN1 |
| Example 10 | 36.9 | 56.4 | 6.7 | 108.4 | SAE | GLAG6 | BSESN6 |
| Example 24 | 23.6 | 74.1 | 2.3 | 127.0 | SAE | GLAG6 | SCASN4/SCASN5 (75/25) |
| Comparative Example 12 | 27.7 | 64.7 | 7.6 | 38.7 | CMSC | GYAG2 | SCASN5 |

Examples 11 to 14, and 25, and Comparative Examples 5, 6 and 13

Light emitting devices were fabricated in the same manner as in Example 1, except for blending the first fluorescent material 71, the second fluorescent material 72, and the third fluorescent material 73 such that the chromaticity coordinate in CIE1931 was located in the vicinity of X=0.382 and Y=0.380; and changing the kinds of the first fluorescent material 71, the second fluorescent material 72, and the third fluorescent material 73 and the content of each of the fluorescent materials relative to the fluorescent material total amount as shown in the following Table 5. The aforementioned chromaticity coordinate is about 4,000K in terms of the correlated color temperature of the light emitting device and is corresponding to a range where the correlated color temperature is 3,500K or higher and lower than 4,500K.

TABLE 5

|  | Fluorescent material content (% by mass) | | | Content | Fluorescent material | | |
|---|---|---|---|---|---|---|---|
|  | First fluorescent material $MP_1$ | Second fluorescent material $MP_2$ | Third fluorescent material $MP_3$ | relative to resin (% by mass) | First fluorescent material | Second fluorescent material | Third fluorescent material |
| Comparative Example 5 | 0.0 | 96.1 | 3.9 | 89.2 | — | LAG3/GYAG2 (90/10) | SCASN3/SCASN5 (40/60) |
| Comparative Example 6 | 69.1 | 27.1 | 3.8 | 115.8 | SAE | YAG1 | SCASN3 |
| Example 11 | 59.6 | 34.1 | 6.4 | 100.8 | SAE | GYAG4 | SCASN2 |
| Example 12 | 43.5 | 51.4 | 5.1 | 137.9 | SAE | LAG5 | SCASN2 |
| Example 13 | 20.7 | 74.3 | 4.9 | 144.6 | SAE | LAG5 | SCASN2 |
| Example 14 | 22.0 | 73.1 | 4.9 | 136.3 | SAE | GLAG6 | SCASN2 |
| Example 25 | 17.1 | 80.6 | 2.2 | 175.0 | SAE | GLAG6 | SCASN5 |
| Comparative Example 13 | 29.4 | 62.4 | 8.2 | 51.0 | CMSC | GYAG2 | SCASN5 |

Examples 15 to 18, and 26, and Comparative Examples 7, 8 and 14

Light emitting devices were fabricated in the same manner as in Example 1, except for blending the first fluorescent material 71, the second fluorescent material 72, and the third fluorescent material 73 such that the chromaticity coordinate in CIE1931 was located in the vicinity of X=0.434 and Y=0.403; and changing the kinds of the first fluorescent material 71, the second fluorescent material 72, and the third fluorescent material 73 and the content of each of the fluorescent materials relative to the fluorescent material total amount as shown in the following Table 6. The aforementioned chromaticity coordinate is about 3,000K in terms of the correlated color temperature of the light emitting device and is corresponding to a range where the correlated color temperature is 2,800K or higher and lower than 3,500K.

TABLE 6

| | Fluorescent material content (% by mass) | | | | Fluorescent material | | |
|---|---|---|---|---|---|---|---|
| | First fluorescent material $MP_1$ | Second fluorescent material $MP_2$ | Third fluorescent material $MP_3$ | Content relative to resin (% by mass) | First fluorescent material | Second fluorescent material | Third fluorescent material |
| Comparative Example 7 | 0.0 | 95.0 | 5.0 | 133.0 | — | LAG3/GYAG2 (90/10) | SCASN3/SCASN5 (20/80) |
| Comparative Example 8 | 46.0 | 50.2 | 3.8 | 130.5 | SAE | YAG1 | SCASN5 |
| Example 15 | 46.5 | 48.8 | 4.7 | 129.1 | SAE | GYAG4 | SCASN4 |
| Example 16 | 28.4 | 68.3 | 3.3 | 211.0 | SAE | LAG5 | SCASN4 |
| Example 17 | 14.7 | 81.8 | 3.5 | 203.5 | SAE | LAG5 | SCASN4 |
| Example 18 | 14.2 | 82.5 | 3.3 | 211.3 | SAE | GLAG6 | SCASN4 |
| Example 26 | 12.1 | 85.4 | 2.5 | 247.8 | SAE | GLAG6 | SCASN5 |
| Comparative Example 14 | 36.2 | 54.4 | 9.4 | 80.8 | CMSC | GYAG2 | SCASN5 |

Examples 19 to 22 and Comparative Examples 9 and 10

Light emitting devices were fabricated in the same manner as in Example 1, except for blending the first fluorescent material 71, the second fluorescent material 72, and the third fluorescent material 73 such that the chromaticity coordinate in CIE1931 was located in the vicinity of X=0.458 and Y=0.410; and changing the kinds of the first fluorescent material 71, the second fluorescent material 72, and the third fluorescent material 73 and the content of each of the fluorescent materials relative to the fluorescent material total amount as shown in the following Table 7. The aforementioned chromaticity coordinate is about 2,700K in terms of the correlated color temperature of the light emitting device and is corresponding to a range where the correlated color temperature is 2,000K or higher and lower than 2,800K.

TABLE 7

| | Fluorescent material content (% by mass) | | | | Fluorescent material | | |
|---|---|---|---|---|---|---|---|
| | First fluorescent material $MP_1$ | Second fluorescent material $MP_2$ | Third fluorescent material $MP_3$ | Content relative to resin (% by mass) | First fluorescent material | Second fluorescent material | Third fluorescent material |
| Comparative Example 9 | 0.0 | 94.4 | 5.6 | 160.8 | — | LAG3/GYAG2 (90/10) | SCASN3/SCASN5 (30/70) |
| Comparative Example 10 | 39.8 | 55.9 | 4.3 | 150.9 | SAE | YAG1 | SCASN5 |
| Example 19 | 41.5 | 53.3 | 5.2 | 144.5 | SAE | GYAG4 | SCASN4 |
| Example 20 | 24.8 | 71.6 | 3.6 | 241.8 | SAE | LAG5 | SCASN4 |
| Example 21 | 12.0 | 84.3 | 3.8 | 251.0 | SAE | LAG5 | SCASN4 |
| Example 22 | 12.0 | 84.5 | 3.4 | 249.4 | SAE | GLAG6 | SCASN4 |

Chromaticity (x,y), General Color Rendering Index Ra, Special Color Rendering Index R9, and Correlated Color Temperature With respect to the light emitting device in each of the Examples and Comparative Examples, the chromaticity coordinate (chromaticity: x,y) of the light emitting color, the general coloring rendering index Ra and the special color rendering index R9 in conformity with JIS Z8726, and the correlated color temperature (Tcp: K) in conformity with JIS Z8725 were measured by using a light measurement system in which a multi-channel spectroscope and an integral sphere were combined.

Relative Luminous Flux

With respect to the light emitting device in each of the Examples and Comparative Examples, the luminous flux was measured with a total luminous flux measurement system using an integral sphere.

As for Examples 1 to 5, and 23, and Comparative Examples 1, 2 and 11, in which the correlated color temperature is corresponding to a range of 5,700K or higher and 7,200K or lower, by defining the luminous flux of the light emitting device of Comparative Example 1 as 100%, the relative luminous flux of each of the other light emitting devices was calculated.

As for Examples 6 to 10, and 24, and Comparative Examples 3, 4 and 12, in which the correlated color temperature is corresponding to a range of 4,500K or higher and lower than 5,700K, by defining the luminous flux of the light emitting device of Comparative Example 3 as 100%, the relative luminous flux of each of the other light emitting devices was calculated.

As for Examples 11 to 14, and 25, and Comparative Examples 5, 6 and 13, in which the correlated color temperature is corresponding to a range of 3,500K or higher and lower than 4,500K, by defining the luminous flux of the light emitting device of Comparative Example 5 as 100%, the relative luminous flux of each of the other light emitting devices was calculated.

As for Examples 15 to 18, and 26, and Comparative Examples 7, 8 and 14, in which the correlated color temperature is corresponding to a range of 2,800K or higher and lower than 3,500K, by defining the luminous flux of the light emitting device of Comparative Example 7 as 100%, the relative luminous flux of each of the other light emitting devices was calculated.

As for Examples 19 to 22 and Comparative Examples 9 and 10, in which the correlated color temperature is corresponding to a range of 2,000K or higher and lower than 2,800K, by defining the luminous flux of the light emitting device of Comparative Example 9 as 100%, the relative luminous flux of each of the other light emitting devices was calculated.

Light Emission Spectra

Light emission spectra exhibiting a relative intensity (relative light emission intensity) to the wavelength of each of the light emitting devices were measured by using the same total luminous flux measurement system as in the measurement of relative luminous flux. In the light emission spectra of each of the light emitting devices, light emission spectra of each of the light emitting devices when defining a maximum value of the light emission intensity as 1 are shown in FIGS. 3 to 11.

In the light emission spectra of the light emitting device, a maximum wavelength width (nm) at which the light emission intensity is 0.3 or more within a range of 480 nm or more and 680 nm or less when defining the maximum value of the light emission intensity as 1 was determined as a wavelength width $I^1_{0.3}$ at intensity of 0.3.

In the light emission spectra of the light emitting device, a maximum wavelength width (nm) at which the light emission intensity is 0.3 or more within a range of 480 nm or more and 580 nm or less when defining the maximum value of the light emission intensity as 1 was determined as a wavelength width $I^2_{0.3}$ at intensity of 0.3.

In the light emission spectra of the light emitting device, a light emission intensity at 480 nm when defining the light emission intensity of the light emitting element as 1 was determined as $I_{480}$.

In the light emission spectra of the light emitting device, when defining a light emission intensity at 535 nm as $I_A$ and defining an average of a light emission intensity at 510 nm and a light emission intensity at 560 nm as $I_B$, a ratio of $I_A$ to $I_B$ ($I_A/I_B$) was determined.

The foregoing measurement results are shown in the following Tables 8 to 12 in accordance with a range of each of the correlated color temperatures.

TABLE 8

| | Chromaticity coordinate | | Color rendering index | | Correlated color temperature | Relative luminous flux | Wavelength width at intensity of 0.3 | | Intensity ratio | Intensity ratio |
|---|---|---|---|---|---|---|---|---|---|---|
| | | | | | | | 480 to 580 nm | 480 to 680 nm | (480 nm) | |
| | x | y | $R_a$ | R9 | (K) | (%) | $I^2_{0.3}$ | $I^1_{0.3}$ | $I_{480}$ | $I_A/I_B$ |
| Comparative Example 1 | 0.312 | 0.328 | 82.1 | 10.9 | 6557 | 100.0 | 73 | 102 | 0.14 | 1.08 |
| Comparative Example 2 | 0.312 | 0.328 | 89.5 | 24.6 | 6567 | 93.9 | 92 | 132 | 0.27 | 0.95 |
| Example 1 | 0.312 | 0.328 | 87.3 | 12.9 | 6562 | 95.7 | 93 | 131 | 0.27 | 0.92 |
| Example 2 | 0.312 | 0.328 | 87.1 | 12.4 | 6556 | 96.2 | 100 | 140 | 0.32 | 0.88 |
| Example 3 | 0.312 | 0.328 | 87.4 | 18.4 | 6551 | 93.4 | 100 | 143 | 0.38 | 0.89 |
| Example 4 | 0.312 | 0.328 | 86.5 | 10.7 | 6544 | 96.6 | 100 | 141 | 0.34 | 0.91 |
| Example 5 | 0.312 | 0.328 | 85.1 | 2.3 | 6553 | 98.2 | 100 | 138 | 0.30 | 0.93 |
| Example 23 | 0.312 | 0.328 | 93.9 | 75.9 | 6528 | 86.5 | 100 | 155 | 0.38 | 0.96 |
| Comparative Example 11 | 0.312 | 0.328 | 91.6 | 69.6 | 6554 | 87.9 | 80 | 123 | 0.16 | 1.09 |

TABLE 9

| | Chromaticity coordinate | | Color rendering index | | Correlated color temperature (K) | Relative luminous flux (%) | Wavelength width at intensity of 0.3 | | Intensity ratio (480 nm) | Intensity ratio |
|---|---|---|---|---|---|---|---|---|---|---|
| | x | y | $R_a$ | R9 | | | 480 to 580 nm $I^2_{0.3}$ | 480 to 680 nm $I^1_{0.3}$ | $I_{480}$ | $I_A/I_B$ |
| Comparative Example 3 | 0.345 | 0.355 | 82.6 | 10.0 | 5015 | 100.0 | 78 | 136 | 0.15 | 1.06 |
| Comparative Example 4 | 0.345 | 0.355 | 84.4 | −1.4 | 5009 | 98.1 | 86 | 141 | 0.23 | 0.97 |
| Example 6 | 0.345 | 0.355 | 83.1 | −6.7 | 5029 | 98.4 | 93 | 148 | 0.26 | 0.91 |
| Example 7 | 0.345 | 0.355 | 83.2 | −9.3 | 5009 | 98.4 | 100 | 156 | 0.31 | 0.87 |
| Example 8 | 0.345 | 0.355 | 84.1 | −2.4 | 5008 | 96.2 | 100 | 159 | 0.38 | 0.88 |
| Example 9 | 0.345 | 0.355 | 85.0 | 8.6 | 5013 | 93.8 | 100 | 163 | 0.49 | 0.91 |
| Example 10 | 0.345 | 0.355 | 81.3 | −7.9 | 5010 | 94.7 | 100 | 158 | 0.35 | 0.87 |
| Example 24 | 0.345 | 0.355 | 92.7 | 66.2 | 5002 | 88.4 | 100 | 176 | 0.43 | 0.95 |
| Comparative Example 12 | 0.345 | 0.355 | 92.9 | 67.3 | 5010 | 88.3 | 84 | 158 | 0.17 | 1.08 |

TABLE 10

| | Chromaticity coordinate | | Color rendering index | | Correlated color temperature (K) | Relative luminous flux (%) | Wavelength width at intensity of 0.3 | | Intensity ratio (480 nm) | Intensity ratio |
|---|---|---|---|---|---|---|---|---|---|---|
| | x | y | $R_a$ | R9 | | | 480 to 580 nm $I^2_{0.3}$ | 480 to 680 nm $I^1_{0.3}$ | $I_{480}$ | $I_A/I_B$ |
| Comparative Example 5 | 0.382 | 0.380 | 83.6 | 17.3 | 3983 | 100.0 | 86 | 171 | 0.19 | 1.01 |
| Comparative Example 6 | 0.382 | 0.380 | 90.0 | 28.9 | 3980 | 95.6 | 95 | 177 | 0.28 | 1.00 |
| Example 11 | 0.382 | 0.380 | 88.1 | 23.4 | 3987 | 96.0 | 100 | 183 | 0.42 | 0.92 |
| Example 12 | 0.382 | 0.380 | 88.6 | 27.1 | 3989 | 95.3 | 100 | 184 | 0.45 | 0.89 |
| Example 13 | 0.382 | 0.380 | 86.1 | 11.7 | 3976 | 99.7 | 100 | 181 | 0.35 | 0.90 |
| Example 14 | 0.382 | 0.380 | 87.7 | 21.3 | 3983 | 96.7 | 100 | 184 | 0.45 | 0.92 |
| Example 25 | 0.382 | 0.380 | 94.0 | 71.5 | 3979 | 86.0 | 100 | 199 | 0.50 | 0.96 |
| Comparative Example 13 | 0.382 | 0.380 | 94.2 | 64.2 | 3966 | 86.8 | 89 | 185 | 0.20 | 1.07 |

TABLE 11

| | Chromaticity coordinate | | Color rendering index | | Correlated color temperature (K) | Relative luminous flux (%) | Wavelength width at intensity of 0.3 | | Intensity ratio (480 nm) | Intensity ratio |
|---|---|---|---|---|---|---|---|---|---|---|
| | x | y | $R_a$ | R9 | | | 480 to 580 nm $I^2_{0.3}$ | 480 to 680 nm $I^1_{0.3}$ | $I_{480}$ | $I_A/I_B$ |
| Comparative Example 7 | 0.434 | 0.403 | 84.2 | 19.2 | 3040 | 100.0 | 82 | 182 | 0.24 | 0.98 |
| Comparative Example 8 | 0.434 | 0.403 | 85.2 | 16.2 | 3042 | 99.2 | 79 | 174 | 0.21 | 1.05 |
| Example 15 | 0.434 | 0.403 | 87.4 | 22.8 | 3044 | 98.0 | 95 | 187 | 0.48 | 0.92 |
| Example 16 | 0.434 | 0.403 | 88.8 | 30.6 | 3045 | 97.1 | 98 | 190 | 0.55 | 0.89 |
| Example 17 | 0.434 | 0.403 | 87.4 | 21.1 | 3041 | 98.9 | 94 | 186 | 0.46 | 0.89 |
| Example 18 | 0.434 | 0.403 | 88.5 | 29.6 | 3037 | 97.3 | 100 | 193 | 0.62 | 0.91 |
| Example 26 | 0.434 | 0.403 | 92.4 | 57.9 | 3041 | 85.4 | 100 | 200 | 0.67 | 0.94 |
| Comparative Example 14 | 0.434 | 0.403 | 95.0 | 59.3 | 3034 | 84.8 | 85 | 185 | 0.26 | 1.05 |

TABLE 12

| | Chromaticity coordinate | | Color rendering index | | Correlated color temperature (K) | Relative luminous flux (%) | Wavelength width at intensity of 0.3 | | Intensity ratio (480 nm) | Intensity ratio |
|---|---|---|---|---|---|---|---|---|---|---|
| | x | y | $R_a$ | R9 | | | 480 to 580 nm $I^2_{0.3}$ | 480 to 680 nm $I^1_{0.3}$ | $I_{480}$ | $I_A/I_B$ |
| Comparative Example 9 | 0.458 | 0.410 | 83.0 | 12.3 | 2723 | 100.0 | 76 | 176 | 0.28 | 0.95 |

TABLE 12-continued

| | Chromaticity coordinate | | Color rendering index | | Correlated color temperature | Relative luminous flux | Wavelength width at intensity of 0.3 | | Intensity ratio (480 nm) | Intensity ratio |
|---|---|---|---|---|---|---|---|---|---|---|
| | | | | | | | 480 to 580 nm | 480 to 680 nm | | |
| | x | y | $R_a$ | R9 | (K) | (%) | $I^2_{0.3}$ | $I^1_{0.3}$ | $I_{480}$ | $I_A/I_B$ |
| Comparative Example 10 | 0.458 | 0.410 | 83.3 | 8.8 | 2719 | 99.9 | 73 | 168 | 0.21 | 1.03 |
| Example 19 | 0.458 | 0.410 | 85.1 | 13.2 | 2724 | 99.7 | 85 | 177 | 0.51 | 0.91 |
| Example 20 | 0.458 | 0.410 | 86.4 | 21.1 | 2721 | 94.6 | 91 | 184 | 0.58 | 0.88 |
| Example 21 | 0.458 | 0.410 | 85.3 | 13.6 | 2722 | 97.2 | 88 | 180 | 0.53 | 0.88 |
| Example 22 | 0.458 | 0.410 | 86.6 | 21.9 | 2724 | 96.0 | 93 | 186 | 0.65 | 0.90 |

In the light emitting devices of the Examples and Comparative Examples having the respective correlated color temperatures, the light emitting device of each of the Examples was wider than the light emitting device of each of the Comparative Examples with respect to the wavelength width $I^1_{0.3}$ of the light emitting emission spectra at 480 nm or more and 680 nm or less and the wavelength width $I^2_{0.3}$ of the light emitting emission spectra at 480 nm or more and 580 nm or less. As noted from FIGS. 3 to 11, the wavelength width $I^1_{0.3}$ and the wavelength width $I^2_{0.3}$ in the light emission spectra of the light emitting device of each of the Examples having the respective correlated color temperatures were wider than the wavelength width $I^1_{0.3}$ and the wavelength width $I^2_{0.3}$ in the light emission spectra of the light emitting device of each of the Comparative Examples having the respective correlated color temperatures. From these results, in particular, in view of the fact that the wavelength width $I^1_{0.3}$ in the range of 480 nm or more and 680 nm or less centering on 555 nm that is a peak of the typical luminous sensitivity at which the human eyes are especially easy to adjust the focus is expanded, and furthermore, the wavelength width $I^2_{0.3}$ in the range of 480 nm or more and 580 nm or less is expanded, it is possible to reduce the human eye fatigue under lighting of this light emitting device and to efficiently perform the human visual work. In addition, in the light emitting device of each of the Examples, in the light emission spectra of the light emitting device, even in the case where the wavelength width $I^1_{0.3}$ and the wavelength width $I^2_{0.3}$ are expanded, a high luminous flux substantially the same as the luminous flux of each of the Comparative Examples at each of the correlated color temperatures was maintained, the reduction of the luminous flux was suppressed, and the high light emission efficiency was maintained.

In the light emitting devices of the Examples and Comparative Examples having the respective correlated color temperatures, the light emitting device of each of the Examples is higher than the light emitting device of each of the Comparative Examples with respect to the intensity ratio $I_{480}$ to the peak intensity of the light emitting device. From these results, the light emitting device lowers the light emission intensity of the light emitting element emitting a blue light as a cause for glare, which is close to a wavelength region in the vicinity of 440 nm acting on an S cone that is one of human photoreceptor cells, and is able to reduce the human eye fatigue to be caused due to the glare. In view of the fact that the light emitting device of each of the Examples is higher than the light emitting device of each of the Comparative Examples with respect to the intensity ratio $I_{480}$ to the peak intensity of the light emitting element, the stimulation to ipRGC that is one of human photoreceptor cells can be controlled, and as a result, the aforementioned light emitting device also has an effect for awakening a human being during visual work and maintaining the ability of concentration. Furthermore, a bluish-green component in the light emission spectra increases, and for example, it becomes possible to constitute a light emitting device capable of compensating a lowering of discrimination of a blue light with age of a human being.

In the light emitting devices of the Examples and Comparative Examples having the respective correlated color temperatures, the light emitting device of each of the Examples is lower than the light emitting device of each of the Comparative Examples with respect to the ratio $I_A/I_B$. From these results, the light emitting devices of the Examples having the respective correlated color temperatures not only lower the light emission intensity of the light emitting element emitting a blue light which is close to a wavelength region in the vicinity of 440 nm acting on an S cone that is a human photoreceptor cell to reduce the human eye fatigue to be caused due to the glare but also lower the light emission intensity of a green light in a wavelength region in the vicinity of 535 nm acting on an M cone to reduce excessive stimulation to the M cone, whereby the human eye fatigue to be caused due to the glare can be more reduced.

The light emitting device of an embodiment of the present disclosure is able to emit a light capable of reducing the human eye fatigue under lighting and having light emission spectra with excellent workability. The light emitting device of an embodiment of the present disclosure can be utilized as general lighting to be installed in indoors, such as offices, general households, commercial facilities, and factories, in-vehicle lighting, display, lighting for observation, warning light, outdoor security light, indicator light, and backlight for liquid crystal. Furthermore, a lighting fixture provided with this light emitting device can be provided.

The invention claimed is:

1. A light emitting device provided with a fluorescent member comprising
   a light emitting element having a light emission peak wavelength in a range of 440 nm or more and 470 nm or less,
   a first fluorescent material having a light emission peak wavelength in a range of 480 nm or more and 518 nm or less,
   a second fluorescent material having a light emission peak wavelength in a range of 510 nm or more and less than 590 nm and having an x value of the chromaticity coordinate in CIE1931 in a range of 0.27 or more and 0.40 or less, and
   a third fluorescent material having a light emission peak wavelength in a range of 590 nm or more and 670 nm or less, wherein a content (% by mass) of the first fluorescent material relative to a total amount of the first fluorescent material, the second fluorescent material and the third fluorescent material is defined as $MP_1$, a content (% by mass) of the second fluorescent material relative to the total amount of the first fluorescent material, the second fluorescent material and the third fluorescent material is defined as $MP_2$, wherein for a maximum value of a light emission intensity in a light emission spectrum of the light emitting device as 1, a maximum wavelength width (nm) at which a light emission intensity in a range of 480 nm or more and 680 nm or less is 0.3 or more is defined as $I^1_{0.3}$, and a maximum wavelength width (nm) at which a light emission intensity in a range of 480 nm or more and 580 nm or less is 0.3 or more is defined as $I^2_{0.3}$, wherein for a correlated color temperature within each of the following ranges, the content $MP_1$, the content $MP_2$, the width $I^1_{0.3}$ and the width $I^2_{0.3}$ satisfy the following, respectively:

for the correlated color temperature in a range of 2,000K or higher and lower than 2,800K, the content $MP_1$ is in a range of 5% by mass or more and 50% by mass or less, the content $MP_2$ is in a range of 40% by mass or more and 90% by mass or less, the width $I^1_{0.3}$ is in a range of 177 nm or more and 200 nm or less, and the width $I^2_{0.3}$ is in a range of 84 nm or more and 100 nm or less, for the correlated color temperature in a range of 2,800K or higher and lower than 3,500K, the content $MP_1$ is in a range of 5% by mass or more and 50% by mass or less, the content $MP_2$ is in a range of 40% by mass or more and 90% by mass or less, the width $I^1_{0.3}$ is in a range of 183 nm or more and 200 nm or less, and the width $I^2_{0.3}$ is in a range of 86 nm or more and 100 nm or less, for the correlated color temperature in a range of 3,500K or higher and lower than 4,500K, the content $MP_1$ is in a range of 5% by mass or more and 65% by mass or less, the content $MP_2$ is in a range of 30% by mass or more and 85% by mass or less, the width $I^1_{0.3}$ is in a range of 173 nm or more and 200 nm or less, and the width $I^2_{0.3}$ is in a range of 90 nm or more and 100 nm or less, for the correlated color temperature in a range of 4,500K or higher and lower than 5,700K, the content $MP_1$ is in a range of 5% by mass or more and 50% by mass or less, the content $MP_2$ is in a range of 40% by mass or more and 80% by mass or less, the width $I^1_{0.3}$ is in a range of 140 nm or more and 180 nm or less, and the width $I^2_{0.3}$ is in a range of 85 nm or more and 100 nm or less, and for the correlated color temperature in a range of 5,700K or higher and 7,200K or lower, the content $MP_1$ is in a range of 5% by mass or more and 50% by mass or less, the content $MP_2$ is in a range of 40% by mass or more and 80% by mass or less, and the width $I^1_{0.3}$ is in a range of 110 nm or more and 160 nm or less and the width $I^2_{0.3}$ is in a range of 81 nm or more and 100 nm or less, wherein the first fluorescent material includes a fluorescent material having a composition represented by the following formula (1A):

$$(Sr_{1-v}M^1_v)_4Al_{14}O_{25}:Eu \qquad (1A)$$

wherein $M^1$ is at least one element selected from the group consisting of Mg, Ca, Ba, and Zn, and $0 \leq v \leq 5$.

2. The light emitting device according to claim 1, wherein when the light emission intensity at 480 nm in the light emission spectrum of the light emitting device is defined as an intensity ratio $I_{480}$ when a light emission intensity of the light emitting element is defined as 1, in the case where a correlated color temperature of the light emitting device falls within each of the following ranges, the intensity ratio $I_{480}$ satisfies the following, respectively:

in the case where the correlated color temperature is in a range of 2,000K or higher and lower than 2,800K, the intensity ratio $I_{480}$ is in a range of 0.30 or more and 0.80 or less;

in the case where the correlated color temperature is in a range of 2,800K or higher and lower than 3,500K, the intensity ratio $I_{480}$ is in a range of 0.25 or more and 0.70 or less;

in the case where the correlated color temperature is in a range of 3,500K or higher and lower than 4,500K, the intensity ratio $I_{480}$ is in a range of 0.20 or more and 0.60 or less;

in the case where the correlated color temperature is in a range of 4,500K or higher and lower than 5,700K, the intensity ratio $I_{480}$ is in a range of 0.17 or more and 0.60 or less; and in the case where the correlated color temperature is in a range of 5,700K or higher and 7,200K or lower, the intensity ratio $I_{480}$ is in a range of 0.16 or more and 0.50 or less.

3. The light emitting device according to claim 1, wherein in the light emission spectrum of the light emitting device, when a light emission intensity at 535 nm is defined as $I_A$, and an average of a light emission intensity at 510 nm and a light emission intensity at 560 nm is defined as $I_B$, a ratio of $I_A$ to $I_B$ ($I_A/I_B$) is in a range of 0.8 or more and 0.96 or less.

4. The light emitting device according to claim 1, wherein the first fluorescent material has a light emission peak wavelength in a range of 485 nm or more and 518 nm or less, and a full width at half maximum in a range of 30 nm or more and 80 nm or less.

5. The light emitting device according to claim 1, wherein the second fluorescent material has a light emission peak wavelength of in a range of 510 nm or more and 550 nm or less, and a full width at half maximum in a range of 20 nm or more and 120 nm or less.

6. The light emitting device according to claim 1, wherein the third fluorescent material has a light emission peak wavelength of in a range of 590 nm or more and 630 nm or less, and a full width at half maximum in a range of 5 nm or more and 100 nm or less.

7. The light emitting device according to claim 1, wherein the light emitting element has a light emission peak in a range of 440 nm or more and 470 nm or less and a full width at half maximum in a range of 30 nm or less.

8. The light emitting device according to claim 1, wherein a general color rendering index Ra of the light emitting device is 80 or more.

9. The light emitting device according to claim 1, wherein the second fluorescent material is a fluorescent material having a composition represented by the following formula (2A):

$$(Ln_{1-a}Ce_a)_3(Al_{1-b}Ga_b)_5O_{12} \qquad (2A)$$

wherein Ln is at least one element selected from the group consisting of Y, Gd, Lu, and Tb, $0.001 \leq a \leq 0.20$, and $0 \leq b \leq 1.0$.

10. The light emitting device according to claim 1, wherein the third fluorescent material is at least one selected from a fluorescent material having a composition represented by the following formula (3A), a fluorescent material having a composition represented by the following formula (3B), and a fluorescent material having a composition represented by the following formula (3C):

$$(Ca_{1-p}Sr_p)AlSiN_3:Eu \quad (3A)$$

wherein $0 \leq p \leq 1.0$;

$$(Ca_{1-q-r}Sr_qBa_r)_2Si_5N_8:Eu \quad (3B)$$

wherein $0 \leq q \leq 1.0$, $0 \leq r \leq 1.0$, and $(q+r) \leq 1.0$;

$$M^4_kSi_{12-(m+n)}Al_{m+n}O_nN_{16-n}:Eu \quad (3C)$$

wherein $M^4$ is at least one element selected from the group consisting of Li, Mg, Ca, Sr, Y, and a lanthanoid element (provided that La and Ce are excluded), $0 < k \leq 2.0$, $2.0 \leq m \leq 6.0$, and $0 \leq n \leq 1.0$.

11. A lighting fixture comprising the light emitting device according to claim 1.

* * * * *